US008213212B2

(12) United States Patent
Sargent et al.

(10) Patent No.: US 8,213,212 B2
(45) Date of Patent: Jul. 3, 2012

(54) METHODS OF MAKING QUANTUM DOT FILMS

(75) Inventors: Edward Sargent, Toronto (CA); Gerasimos Konstantatos, Barcelona (ES); Larissa Levina, Toronto (CA); Ian Howard, Hattersheim (DE); Ethan J. D. Klem, Durham, NC (US); Jason Clifford, Hillsboro, OR (US)

(73) Assignee: InVisage Technologies, Inc., Menlo Park, CA (US)

( * ) Notice: Subject to any disclaimer, the term of this patent is extended or adjusted under 35 U.S.C. 154(b) by 0 days.

(21) Appl. No.: 13/242,397

(22) Filed: Sep. 23, 2011

(65) Prior Publication Data

US 2012/0100699 A1    Apr. 26, 2012

Related U.S. Application Data

(60) Continuation of application No. 12/780,026, filed on May 14, 2010, now Pat. No. 8,054,671, which is a division of application No. 11/509,318, filed on Aug. 24, 2006, now Pat. No. 7,746,681, which is a continuation-in-part of application No. 11/327,655, filed on Jan. 9, 2006, now Pat. No. 8,115,232.

(60) Provisional application No. 60/710,944, filed on Aug. 25, 2005, provisional application No. 60/641,766, filed on Jan. 7, 2005.

(51) Int. Cl.
*G11C 11/00* (2006.01)

(52) U.S. Cl. ........... 365/129; 257/9; 97/773; 97/774

(58) Field of Classification Search ........... 365/129, 365/161, 163; 257/1, 14–25, 59, 72, 250, 257/E29.071, E25.004, E27.083, E27.16; 438/48, 197, 479, 590, 962; 428/403, 407; 252/301.4, 301.6; 977/708, 774, 775, 773, 977/778, 759, 847; 372/43; 435/472; 424/484; 385/122; 600/425

See application file for complete search history.

(56) References Cited

U.S. PATENT DOCUMENTS 3,962,141 A    6/1976    Inoue et al.
(Continued)

FOREIGN PATENT DOCUMENTS

KR    1020040091898    11/2004
(Continued)

OTHER PUBLICATIONS

"", Photoconductivity Conference, Atlantic City, NJ, Wiley, (Nov. 4-6, 1954).
(Continued)

*Primary Examiner* — Richard Elms
*Assistant Examiner* — Harry W Byrne
(74) *Attorney, Agent, or Firm* — Schwegman, Lundberg & Woessner, P.A.

(57) ABSTRACT

In an example embodiment, an optical device includes an integrated circuit, an array of conductive regions, and an optically sensitive material over at least a portion of the integrated circuit and in electrical communication with at least one conductive region. In another example embodiment, a method of forming a nanocrystalline film includes fabricating nanocrystals having a plurality of first ligands attached to their outer surfaces, exchanging the first ligands for second ligands of a different chemical composition, forming a film of the ligand-exchanged nanocrystals, removing the second ligands, and fusing the cores of adjacent nanocrystals in the film to form an electrical network of fused nanocrystals. In another example embodiment, a film includes a network of fused nanocrystals with at least portions of the fused nanocrystals being in direct physical contact with adjacent nanocrystals, the film having substantially no defect states in regions where cores of the nanocrystals are fused.

1 Claim, 18 Drawing Sheets

U.S. PATENT DOCUMENTS

| | | |
|---|---|---|
| 3,968,360 A | 7/1976 | Monnier |
| 4,002,902 A | 1/1977 | Donjon et al. |
| 4,117,329 A | 9/1978 | Kruer et al. |
| 4,183,748 A | 1/1980 | Murai et al. |
| 4,888,521 A | 12/1989 | Tanioka et al. |
| 4,948,741 A | 8/1990 | Hammond et al. |
| 4,952,839 A | 8/1990 | Tanioka et al. |
| 5,014,069 A | 5/1991 | Seiler et al. |
| 5,124,545 A | 6/1992 | Takanashi et al. |
| 5,130,826 A | 7/1992 | Takanashi et al. |
| 5,233,265 A | 8/1993 | Takasaki et al. |
| 5,260,957 A | 11/1993 | Hakimi et al. |
| 5,262,357 A | 11/1993 | Alivisatos et al. |
| 5,294,992 A | 3/1994 | Konno et al. |
| 5,299,042 A | 3/1994 | Takanashi et al. |
| 5,350,915 A | 9/1994 | Ishihara et al. |
| RE34,947 E | 5/1995 | Takanashi et al. |
| 5,438,198 A | 8/1995 | Ebitani et al. |
| 5,500,188 A | 3/1996 | Hafeman et al. |
| 5,505,928 A | 4/1996 | Alivisatos et al. |
| 5,537,000 A | 7/1996 | Alivisatos et al. |
| 5,591,962 A | 1/1997 | Koishi et al. |
| 5,614,708 A | 3/1997 | Koishi et al. |
| 5,703,436 A | 12/1997 | Forrest et al. |
| 5,751,018 A | 5/1998 | Alivisatos et al. |
| 5,818,053 A | 10/1998 | Tran |
| 5,834,893 A | 11/1998 | Bulovic et al. |
| 5,844,253 A | 12/1998 | Kim et al. |
| 5,923,028 A | 7/1999 | Turnbull et al. |
| 5,923,953 A | 7/1999 | Goldenberg Barany et al. |
| 5,929,689 A | 7/1999 | Wall |
| 5,953,587 A | 9/1999 | Forrest et al. |
| 5,986,268 A | 11/1999 | Forrest et al. |
| 5,990,479 A | 11/1999 | Weiss et al. |
| 5,998,803 A | 12/1999 | Forrest et al. |
| 6,005,252 A | 12/1999 | Forrest et al. |
| 6,046,543 A | 4/2000 | Bulovic et al. |
| 6,064,054 A | 5/2000 | Waczynski et al. |
| 6,107,630 A | 8/2000 | Mazurowski et al. |
| 6,111,902 A | 8/2000 | Kozlov et al. |
| 6,160,828 A | 12/2000 | Kozlov et al. |
| 6,198,091 B1 | 3/2001 | Forrest et al. |
| 6,198,092 B1 | 3/2001 | Bulovic et al. |
| 6,207,229 B1 | 3/2001 | Bawendi et al. |
| 6,207,392 B1 | 3/2001 | Weiss et al. |
| 6,210,814 B1 | 4/2001 | Thompson et al. |
| 6,214,631 B1 | 4/2001 | Burrows et al. |
| 6,225,198 B1 | 5/2001 | Alivisatos et al. |
| 6,239,449 B1 | 5/2001 | Fafard et al. |
| 6,251,303 B1 | 6/2001 | Bawendi et al. |
| 6,264,805 B1 | 7/2001 | Forrest et al. |
| 6,278,055 B1 | 8/2001 | Bulovic et al. |
| 6,287,712 B1 | 9/2001 | Bulovic et al. |
| 6,294,794 B1 | 9/2001 | Yoshimura et al. |
| 6,297,495 B1 | 10/2001 | Bulovic et al. |
| 6,297,516 B1 | 10/2001 | Forrest et al. |
| 6,306,610 B1 | 10/2001 | Bawendi et al. |
| 6,306,736 B1 | 10/2001 | Alivisatos et al. |
| 6,312,836 B1 | 11/2001 | Bulovic et al. |
| 6,319,426 B1 | 11/2001 | Bawendi et al. |
| 6,322,901 B1 | 11/2001 | Bawendi et al. |
| 6,326,144 B1 | 12/2001 | Bawendi et al. |
| 6,333,458 B1 | 12/2001 | Forrest et al. |
| 6,342,325 B1 | 1/2002 | Suda et al. |
| 6,352,777 B1 | 3/2002 | Bulovic et al. |
| 6,396,860 B1 | 5/2002 | Kozlov et al. |
| 6,403,392 B1 | 6/2002 | Burrows et al. |
| 6,407,408 B1 | 6/2002 | Zhou et al. |
| 6,423,551 B1 | 7/2002 | Weiss et al. |
| 6,423,980 B1 | 7/2002 | Bandara et al. |
| 6,426,513 B1 | 7/2002 | Bawendi et al. |
| 6,440,213 B1 | 8/2002 | Alivisatos et al. |
| 6,440,769 B2 | 8/2002 | Peumans et al. |
| 6,444,143 B2 | 9/2002 | Bawendi et al. |
| 6,451,415 B1 | 9/2002 | Forrest et al. |
| 6,458,426 B1 | 10/2002 | Bulovic et al. |
| 6,487,112 B1 * | 11/2002 | Wasshuber .................. 365/163 |
| 6,501,091 B1 | 12/2002 | Bawendi et al. |
| 6,509,066 B1 | 1/2003 | Jost |
| 6,538,801 B2 | 3/2003 | Jacobson et al. |
| 6,548,316 B1 | 4/2003 | Tam et al. |
| 6,548,956 B2 | 4/2003 | Forrest et al. |
| 6,576,291 B2 | 6/2003 | Bawendi et al. |
| 6,596,134 B2 | 7/2003 | Forrest et al. |
| 6,602,671 B1 | 8/2003 | Bawendi et al. |
| 6,605,806 B2 | 8/2003 | Walmsley et al. |
| 6,607,829 B1 | 8/2003 | Bawendi et al. |
| 6,617,583 B1 | 9/2003 | Bawendi et al. |
| 6,670,544 B2 | 12/2003 | Kibbel et al. |
| 6,690,012 B1 | 2/2004 | Jacksen et al. |
| 6,692,820 B2 | 2/2004 | Forrest et al. |
| 6,696,299 B1 | 2/2004 | Empedocles et al. |
| 6,699,723 B1 | 3/2004 | Weiss et al. |
| 6,710,366 B1 * | 3/2004 | Lee et al. .................. 257/14 |
| 6,727,065 B2 | 4/2004 | Weiss et al. |
| 6,730,914 B2 | 5/2004 | Chao et al. |
| 6,743,516 B2 | 6/2004 | Murphy et al. |
| 6,774,361 B2 | 8/2004 | Bawendi et al. |
| 6,781,868 B2 | 8/2004 | Bulovic et al. |
| 6,791,130 B2 | 9/2004 | Chao et al. |
| 6,798,033 B2 | 9/2004 | Chao et al. |
| 6,803,719 B1 | 10/2004 | Miller et al. |
| 6,809,358 B2 | 10/2004 | Hsieh et al. |
| 6,809,955 B2 | 10/2004 | Bulovic et al. |
| 6,819,692 B2 | 11/2004 | Klimov et al. |
| 6,821,337 B2 | 11/2004 | Bawendi et al. |
| 6,844,025 B2 | 1/2005 | Forrest et al. |
| 6,844,608 B2 | 1/2005 | Bulovic et al. |
| 6,853,013 B2 | 2/2005 | Hirai et al. |
| 6,855,202 B2 | 2/2005 | Alivisatos et al. |
| 6,855,551 B2 | 2/2005 | Bawendi et al. |
| 6,861,155 B2 | 3/2005 | Bawendi et al. |
| 6,864,626 B1 | 3/2005 | Weiss et al. |
| 6,878,871 B2 | 4/2005 | Scher et al. |
| 6,884,478 B2 | 4/2005 | Alivisatos et al. |
| 6,890,777 B2 | 5/2005 | Bawendi et al. |
| 6,900,458 B2 | 5/2005 | Tung et al. |
| 6,914,265 B2 | 7/2005 | Bawendi et al. |
| 6,917,055 B2 | 7/2005 | Stegmuller et al. |
| 6,918,946 B2 | 7/2005 | Korgel et al. |
| 6,921,496 B2 | 7/2005 | Anderson et al. |
| 6,927,069 B2 | 8/2005 | Weiss et al. |
| 6,939,604 B1 | 9/2005 | Guyot-Sionnest et al. |
| 6,984,369 B1 | 1/2006 | Alivisatos et al. |
| 7,012,363 B2 | 3/2006 | Weaver et al. |
| 7,026,041 B2 | 4/2006 | Forrest et al. |
| 7,042,003 B2 | 5/2006 | Jang et al. |
| 7,045,956 B2 | 5/2006 | Braune et al. |
| 7,049,148 B2 | 5/2006 | Bawendi et al. |
| 7,060,243 B2 | 6/2006 | Bawendi et al. |
| 7,132,787 B2 | 11/2006 | Ozkan et al. |
| 7,194,173 B2 | 3/2007 | Shtein et al. |
| 7,419,846 B2 | 9/2008 | Shtein et al. |
| 7,435,617 B2 | 10/2008 | Shtein et al. |
| 7,531,120 B2 | 5/2009 | Van Rijn et al. |
| 7,597,927 B2 | 10/2009 | Peumans et al. |
| 7,742,322 B2 | 6/2010 | Sargent et al. |
| 7,746,681 B2 | 6/2010 | Sargent et al. |
| 7,763,794 B2 | 7/2010 | Hantschel et al. |
| 7,773,404 B2 | 8/2010 | Sargent et al. |
| 7,881,091 B2 | 2/2011 | Sargent et al. |
| 8,023,306 B2 | 9/2011 | Sargent et al. |
| 2001/0000005 A1 | 3/2001 | Forrest et al. |
| 2001/0011551 A1 | 8/2001 | Peumans et al. |
| 2001/0023078 A1 | 9/2001 | Bawendi et al. |
| 2001/0040232 A1 | 11/2001 | Bawendi et al. |
| 2001/0046244 A1 | 11/2001 | Klimov et al. |
| 2002/0071952 A1 | 6/2002 | Bawendi et al. |
| 2002/0072234 A1 | 6/2002 | Weiss et al. |
| 2002/0110180 A1 | 8/2002 | Barney et al. |
| 2002/0119297 A1 | 8/2002 | Forrest et al. |
| 2002/0153243 A1 | 10/2002 | Forrest et al. |
| 2002/0160412 A1 | 10/2002 | Bawendi et al. |
| 2002/0163057 A1 | 11/2002 | Bulovic et al. |
| 2002/0163829 A1 | 11/2002 | Bulovic et al. |
| 2002/0163830 A1 | 11/2002 | Bulovic et al. |
| 2002/0182632 A1 | 12/2002 | Anderson et al. |

| | | |
|---|---|---|
| 2002/0197462 A1 | 12/2002 | Forrest et al. |
| 2003/0003300 A1 | 1/2003 | Korgel et al. |
| 2003/0099968 A1 | 5/2003 | Weiss et al. |
| 2003/0100130 A1 | 5/2003 | Weiss et al. |
| 2003/0113709 A1 | 6/2003 | Alivisatos et al. |
| 2003/0127659 A1 | 7/2003 | Bawendi et al. |
| 2003/0127660 A1 | 7/2003 | Bawendi et al. |
| 2003/0127973 A1 | 7/2003 | Weaver et al. |
| 2003/0136943 A1 | 7/2003 | Alivisatos et al. |
| 2003/0142944 A1 | 7/2003 | Sundar et al. |
| 2003/0145779 A1 | 8/2003 | Alivisatos et al. |
| 2003/0209105 A1 | 11/2003 | Bawendi et al. |
| 2003/0213967 A1 | 11/2003 | Forrest et al. |
| 2003/0226498 A1 | 12/2003 | Alivisatos et al. |
| 2004/0004982 A1* | 1/2004 | Eisler et al. ............ 372/43 |
| 2004/0017834 A1 | 1/2004 | Sundar et al. |
| 2004/0023010 A1 | 2/2004 | Bulovic et al. |
| 2004/0031965 A1 | 2/2004 | Forrest et al. |
| 2004/0031966 A1 | 2/2004 | Forrest et al. |
| 2004/0033359 A1 | 2/2004 | Bawendi et al. |
| 2004/0038310 A1 | 2/2004 | Bawendi et al. |
| 2004/0091710 A1* | 5/2004 | Bawendi et al. ............ 428/407 |
| 2004/0094757 A1 | 5/2004 | Braune et al. |
| 2004/0099307 A1 | 5/2004 | Sun |
| 2004/0110002 A1 | 6/2004 | Kim et al. |
| 2004/0115817 A1* | 6/2004 | Liu et al. ............ 435/472 |
| 2004/0118448 A1* | 6/2004 | Scher et al. ............ 136/252 |
| 2004/0126072 A1* | 7/2004 | Hoon Lee et al. ............ 385/122 |
| 2004/0146560 A1* | 7/2004 | Whiteford et al. ............ 424/484 |
| 2004/0151887 A1 | 8/2004 | Forrest et al. |
| 2004/0164292 A1 | 8/2004 | Tung et al. |
| 2004/0191915 A1 | 9/2004 | Bawendi et al. |
| 2004/0217298 A1 | 11/2004 | Bawendi et al. |
| 2004/0259363 A1 | 12/2004 | Bawendi et al. |
| 2005/0002635 A1 | 1/2005 | Banin et al. |
| 2005/0017176 A1 | 1/2005 | Koch et al. |
| 2005/0020922 A1 | 1/2005 | Frangioni et al. |
| 2005/0020923 A1 | 1/2005 | Frangioni et al. |
| 2005/0031888 A1 | 2/2005 | Bawendi et al. |
| 2005/0048283 A1 | 3/2005 | Bawendi et al. |
| 2005/0054004 A1 | 3/2005 | Alivisatos et al. |
| 2005/0061363 A1 | 3/2005 | Ginley et al. |
| 2005/0072989 A1 | 4/2005 | Bawendi et al. |
| 2005/0079659 A1* | 4/2005 | Duan et al. ............ 438/197 |
| 2005/0084443 A1 | 4/2005 | Bawendi et al. |
| 2005/0088380 A1 | 4/2005 | Bulovic et al. |
| 2005/0109269 A1 | 5/2005 | Alivisatos et al. |
| 2005/0112849 A1 | 5/2005 | Stott et al. |
| 2005/0116256 A1 | 6/2005 | Bulovic et al. |
| 2005/0118631 A1 | 6/2005 | Bawendi et al. |
| 2005/0120946 A1 | 6/2005 | Hines et al. |
| 2005/0133087 A1 | 6/2005 | Alivisatos et al. |
| 2005/0136232 A1 | 6/2005 | Forrest et al. |
| 2005/0146258 A1 | 7/2005 | Weiss et al. |
| 2005/0196894 A1 | 9/2005 | Maa et al. |
| 2005/0202615 A1 | 9/2005 | Duan et al. |
| 2005/0205879 A1 | 9/2005 | Fukunaga |
| 2005/0211154 A1 | 9/2005 | Alivisatos et al. |
| 2005/0224531 A1 | 10/2005 | Bulovic |
| 2005/0227373 A1 | 10/2005 | Flandre et al. |
| 2005/0230673 A1 | 10/2005 | Mueller et al. |
| 2005/0251027 A1* | 11/2005 | Liu et al. ............ 600/425 |
| 2005/0258418 A1 | 11/2005 | Steckel et al. |
| 2005/0287717 A1 | 12/2005 | Heald et al. |
| 2006/0003464 A1 | 1/2006 | Weiss et al. |
| 2006/0013549 A1 | 1/2006 | Shtein et al. |
| 2006/0019098 A1 | 1/2006 | Chan et al. |
| 2006/0057637 A1 | 3/2006 | Anderson et al. |
| 2006/0060862 A1 | 3/2006 | Bawendi et al. |
| 2006/0068154 A1 | 3/2006 | Parce et al. |
| 2006/0070653 A1 | 4/2006 | Elrod et al. |
| 2006/0073607 A1 | 4/2006 | Rose et al. |
| 2006/0076036 A1 | 4/2006 | Whitefield et al. |
| 2006/0097247 A1 | 5/2006 | Kim et al. |
| 2006/0114960 A1 | 6/2006 | Snee et al. |
| 2006/0115585 A1 | 6/2006 | Bulovic et al. |
| 2006/0157720 A1 | 7/2006 | Bawendi et al. |
| 2006/0159901 A1 | 7/2006 | Tischler et al. |
| 2006/0170331 A1 | 8/2006 | Bertram et al. |
| 2006/0176485 A1 | 8/2006 | Bulovic et al. |
| 2006/0177945 A1 | 8/2006 | Weiss et al. |
| 2006/0181629 A1 | 8/2006 | Miyashita et al. |
| 2006/0182970 A1 | 8/2006 | Bawendi et al. |
| 2006/0243959 A1 | 11/2006 | Sargent et al. |
| 2007/0132052 A1 | 6/2007 | Sargent et al. |
| 2007/0174939 A1 | 7/2007 | Sargent et al. |
| 2009/0038677 A1 | 2/2009 | Su et al. |
| 2009/0266418 A1 | 10/2009 | Hu et al. |
| 2009/0305452 A1 | 12/2009 | Sargent et al. |
| 2010/0133418 A1 | 6/2010 | Sargent et al. |
| 2010/0314529 A1 | 12/2010 | Sargent et al. |
| 2010/0314603 A1 | 12/2010 | Sargent et al. |
| 2010/0317175 A1 | 12/2010 | Sargent et al. |

FOREIGN PATENT DOCUMENTS

| | | |
|---|---|---|
| WO | WO-9315525 A1 | 8/1993 |
| WO | WO-2005101530 A1 | 10/2005 |
| WO | WO-2006072181 A1 | 7/2006 |
| WO | WO-2007102051 A2 | 9/2007 |

OTHER PUBLICATIONS

"U.S. Appl. No. 11/327,655, Advisory Action mailed Apr. 27, 2011", 3 pgs.

"U.S. Appl. No. 11/327,655, Final Office Action mailed Jan. 14, 2011", 9 pgs.

"U.S. Appl. No. 11/327,655, Final Office Action mailed May 13, 2009", 14 pgs.

"U.S. Appl. No. 11/327,655, Non Final Office Action mailed Jul. 23, 2008", 14 pgs.

"U.S. Appl. No. 11/327,655, Non-Final Office Action mailed Feb. 3, 2010", 14 pgs.

"U.S. Appl. No. 11/327,655, Response filed Jan. 23, 2009 to Non Final Office Action mailed Jul. 23, 2008", 15 pgs.

"U.S. Appl. No. 11/327,655, Response filed Mar. 12, 2008 to Restriction Requirement mailed Sep. 18, 2007", 12 pgs.

"U.S. Appl. No. 11/327,655, Response filed Aug. 3, 2010 to Non Final Office Action mailed Feb. 3, 2010", 18 pgs.

"U.S. Appl. No. 11/327,655, Response filed Apr. 6, 2011 to Final Office Action mailed Jan. 14, 2011", 10 pgs.

"U.S. Appl. No. 11/327,655, Restriction Requirement mailed Sep. 18, 2007", 8 pgs.

"U.S. Appl. No. 11/509,318, Non Final Office Action mailed May 28, 2009", 10 pgs.

"U.S. Appl. No. 11/509,318, Notice of Allowance mailed Jan. 8, 2010", 7 pgs.

"U.S. Appl. No. 11/509,318, Notice of Allowance mailed Apr. 19, 2010", 6 pgs.

"U.S. Appl. No. 11/509,318, Response filed Nov. 25, 2009 to Non Final Office Action mailed May 28, 2009", 8 pgs.

"U.S. Appl. No. 11/509,318, Response filed Dec. 8, 2008 to Restriction Requirement mailed Sep. 10, 2008", 7 pgs.

"U.S. Appl. No. 11/509,318, Restriction Requirement mailed Sep. 10, 2008", 6 pgs.

"U.S. Appl. No. 11/510,263, Non Final Office Action mailed May 27, 2009", 7 pgs.

"U.S. Appl. No. 11/510,263, Notice of Allowance mailed Jan. 13, 2010", 7 pgs.

"U.S. Appl. No. 11/510,263, Notice of Allowance mailed Apr. 28, 2010", 7 pgs.

"U.S. Appl. No. 11/510,263, Response filed Nov. 25, 2009 to Non Final Office Action mailed May 27, 2009", 5 pgs.

"U.S. Appl. No. 11/510,263, Response filed Dec. 8, 2008 to Restriction Requirement mailed Sep. 9, 2008", 5 pgs.

"U.S. Appl. No. 11/510,263, Restriction Requirement mailed Sep. 9, 2008", 5 pgs.

"U.S. Appl. No. 11/510,510, Non Final Office Action mailed Aug. 19, 2009", 10 pgs.

"U.S. Appl. No. 11/510,510, Notice of Allowance mailed Feb. 23, 2010", 5 pgs.

"U.S. Appl. No. 11/510,510, Notice of Allowance mailed Jun. 8, 2010", 8 pgs.

"U.S. Appl. No. 11/510,510, Response filed Jan. 18, 2010 to Non Final Office Action mailed Aug. 19, 2009", 17 pgs.
"U.S. Appl. No. 11/510,510, Response filed Mar. 12, 2009 to Restriction Requirement mailed Sep. 18, 2008", 10 pgs.
"U.S. Appl. No. 11/510,510, Restriction Requirement mailed Sep. 18, 2008", 7 pgs.
"U.S. Appl. No. 12/395,592, Non-Final Office Action mailed Jun. 25, 2010", 5 pgs.
"U.S. Appl. No. 12/395,592, Notice of Allowance mailed Nov. 18, 2010", 8 pgs.
"U.S. Appl. No. 12/395,592, Preliminary Amendment filed Feb. 27, 2009", 6 pgs.
"U.S. Appl. No. 12/395,592, Response filed Oct. 25, 2010 to Non Final Office Action mailed Jun. 25, 2010", 9 pgs.
"U.S. Appl. No. 12/395,592, Supplemental Notice of Allowance mailed Dec. 8, 2010", 2 pgs.
"U.S. Appl. No. 12/780,026, Non Final Office Action mailed Dec. 3, 2010", 6 pgs.
"U.S. Appl. No. 12/780,026, Notice of Allowance mailed Jun. 27, 2011", 8 pgs.
"U.S. Appl. No. 12/780,026, Response filed Jun. 1, 2011 to Non Final Office Action mailed Dec. 3, 2010", 40 pgs.
"U.S. Appl. No. 12/780,420, Non Final Office Action mailed Nov. 29, 2010", 6 pgs.
"U.S. Appl. No. 12/780,420, Notice of Allowance mailed May 3, 2011", 9 pgs.
"U.S. Appl. No. 12/780,420, Response filed Mar. 29, 2011 to Non Final Office Action mailed Nov. 29, 2010", 25 pgs.
"U.S. Appl. No. 12/780,420, Supplemental Notice of Allowance mailed Aug. 18, 2011", 2 pgs.
"U.S. Appl. No. 12/852,328 , Response filed Aug. 23, 2011 to Non Final Office Action mailed Feb. 23, 2011", 12 pgs.
"U.S. Appl. No. 12/852,328, Non Final Office Action mailed Feb. 23, 2011", 5 pgs.
"Chinese Application Serial No. 200680036992.7, Office Action mailed Oct. 20, 2009", 10 pgs.
"Chinese Application Serial No. 200680036992.7, Response filed Jan. 19, 2010 to Office Action mailed Oct. 20, 2009", 10 pgs.
"European Application Serial No. 06849502.7, Examiner Notification mailed Feb. 15, 2011", 4 Pgs.
"European Application Serial No. 06849502.7, Examiner Notification Response Filed May 16, 2011", 27 pgs.
"Handbook of Conducting Polymers", Skotheim, ed., Dekker, New York, (1986).
"Handbook of Organic-Inorganic Hybrid Materials and Nanocomposites", Nalva, ed., American Scientific Publishers, (2003).
"International Application Serial No. PCT/CA2005/000594, International Search Report mailed Sep. 6, 2005", 4 pgs.
"International Application Serial No. PCT/IB2006/004160, International Search Report mailed Aug. 24, 2006", 5 pgs.
"International Application Serial No. PCT/IB2006/004160, International Search Report mailed Oct. 2, 2007", 5 pgs.
"International Application Serial No. PCT/IB2006/004160, International Search Report mailed Oct. 20, 2007", 4 pgs.
"International Application Serial No. PCT/IB2006/004160, Written Opinion mailed Oct. 20, 2007", 5 pgs.
Bakueva, et al., "Luminescence and Photovoltaic Effects in Polymer-Based Nanocomposites", Handbook of Organic-Inorganic Hybrid Materials and Nanocomposites, vol. 2, Ch. 5, (2003), 181-215.
Bakueva, L., et al., "Size-Tunable Infrared (1000-1600nm) Electroluminescence from PbS Quantum-Dot Nanocrystals in a Semiconducting Polymer", Applied Physics Letters, vol. 82, (2003), 2895-2897.
Brabec, et al., "A Low-Bandgap Semiconducting Polymer for Photovoltaic Devices and Infrared Diodes", Adv. Funct. Mater., 12, (2002), 709-712.
Brabec, et al., "Origin of the Open Circuit Voltage of Plastic Solar Cells", Adv. Funct. Mater., 11, (2001), 374-380.
Breeze, et al., "The Effects of Processing Conditions on Polymer Photovoltaic Device Performace", Proceedings of SPIE, Kafafi, et. al., eds.,, (2004), 5215:271.

Chang, Tung-Wah Frederick, et al., "Efficient excitation transfer from polymer to nanocrystals", Applied Physics Letters, AIP, American Institute of Physics, Melville, NY, US, vol. 84, No. 21, XP012061587, ISSN: 0003-6951, (May 24, 2004), 4295-4297.
Coe, Seth, et al., "Electroluminescence from single monolayers of nanocrystals in molecular organic devices", Nature, (2002), 800-803.
Comparelli, R., et al., "Improved optical properties of CdS quantum dots by ligand exchange", Materials Science and Engineering C, vol. 23, XP002451931, (Dec. 15, 2003), 1083-1086.
Dabbousi, et al., "Electroluminescence from CdSe Quantum-Dot/Polymer Composites", Appl. Phys. Lett., 66, (1995), 1316-1318.
Drees, et al., "Enhanced Photovoltaic Efficiency in Polymer-Fullerene Composites by Thermally Controlled Interfiffusion", Proceedings of SPIE, Kafafi, et al., eds. 5215, (2004), 89.
Drndic, et al., "Transport Properties of Annealed CdSe Collodial Nanocrystal Solids", Appl. Phys., 92, (2002), 7498.
Ettenberg, M., "A little night vision", Advanced Imaging, vol. 20, (2005), 29-32.
Forrest, "The Path to Ubiquitos and Low-Cost Organic Electronic Appliances on Plastic", Nature, 428, (2004), 911-918.
Gadisa, et al., "Correlation Between Oxidation Potential and Open-Circuit Voltage of Composite Solar Cells Based on Blends of Polythiophenes/Fullerene Derivative", Appl. Phys. Lett., 84, (2004), 1609.
Ginger, et al., "Charge Injection and Transport in Films of CdSe Nanocrystals", J. Appl. Phys., 87, (2000), 1361-1368.
Greczynski, et al., "Energy Level Alignment in Organic-Based Three-Layer Structures Studied by Photoelectron Spectroscopy", J. Appl. Phys., 88, (2000), 7187-7191.
Greenham, et al., "Charge Separation and Transport in Conjugated-Polymer/Semiconductor-Nanocrystal Composites Studied by Photoluminescence Quenching and Photoconductivity", Phys. Rev., B 54, (1996), 17628-17637.
Greenwald, et al., "Polymer-Polymer Rectifying Heterojunction Based on Poly (3,4-dicyanothiophene) and MEH-PPV", J. Polym. Sci. A: Polym. Chem., 36, (1998), 3115-3120.
Henckens, et al., "Poly(thienulene vinylene) Derivatives as Low Band Gap Polymers for Photovoltaic Applications", Thin Sol. Films, 572, (2004), 451.
Hines, et al., "Colloidal PbS Nanocrystals with Size-Tunable Near-Infrared Emission: Observation of Post-Synthesis Self-Narrowing of the Particle Size Distribution", Advanced Materials, vol. 15, (Nov. 2003), 1844-1849.
Huynh, et al., "CdSe Nanocrystal Rods/Poly (3-hexylthiophene) Composite Photovoltaic Devices", Adv. Mater., 11(11), (1999), 923-927.
Huynh, et al., "Controlling the Morphology of Nanocrystal-Polymer Composites for Solar Cells", Adv. Funct. Mater. 13, (2003), 73.
Huynh, et al., "Hybrid Nanorod-Polymer Solar Cells", Science 295, (2002), 2425-2427.
Jin, et al., "Synthesis and Characterization of Highly Luminescent Asymmetric Poly(p-phenylene vinylene) Derivatives for Light-Emitting Diodes", Chem. Mater., 14, (2002), 643-650.
Kim, S., et al., "Near-infrared fluorescent type II quantum dots for sentinel lymph node mapping", Nature Biotechnology, vol. 22, (2004), 93-97.
Kippelen, et al., "Organic Photovoltaics Based on Self-Assembled Mesophases", NCPV and Solar Program Review Meeting, NREL/CD-520-33586, (2003), 431.
Klem, Ethan, et al., "PbS quantum dot electroabsorption modulation across the extended communications band 1200-1700 nm", Applied Physics Letter, AIP, American Institute of Physics, Melville, NY, US, vol. 87, No. 5, XP012077333, ISSN: 0003-6951, (Jul. 25, 2005), 53101-53101.
Klimov, "Charge Carrier Dynamics and Optical Gain in Nanocrystal Quantum Dots: From Fundamental Photophysics to Quantum-Dot Lasing", Chapter 5 of Semiconductor and Metal Nanocrystals: Synthesis and Electronic and Optical Properties, (2004), 159-214.
Koetse, et al., "The Influence of the Polymer Architecture on Morphology and Device Properties of Polymer Bulk Heterojunction Photovoltaic Cells", Proceedings of SPIE, Kafafi, et al., eds., 5215, (2004), 119.

Konstantatos, G., et al., "Ultrasensitive solution-case quantum dot photodetectors", Nature, vol. 442, (2006), 180-183.

Lee, et al., "Luminescent Spectral Changes in Polymer Light-Emitting Diodes after Heat Treatments", Molec. Cryst. and Liq. Crust. 349, (2000), 451-454.

Lim, Y., et al., "Selection of quantum dot wavelengths for biomedical assays and imaging", Molecular Imaging, vol. 2, (2003), 50-64.

Mattoussi, et al., "Electroluminescence from Heterostructures of Poly(phenylene vinylene) and Inorganic CdSe Nanocrystals", J. Appl. Phys., 83, (1998), 7965-7947.

McDonald, S., et al., "Photoconductivity from PbS-nanocrystal/semiconducting polymer composites from solution-processible, quantum-size tunable infrared photodetectors", Applied Physics Letters, AIP, American Institute of Physics, Melville, NY, US, vol. 85, No. 11, XP012062554, ISSN: 0003-6951, (Sep. 15, 2004), 2089-2091.

McDonald, S., et al., "Solution-processed PbS quantum dot infrared photodetectors and photovoltaics", Nature Materials, vol. 4, (2005), 138-142.

Murray, et al., "Synthesis and Characterization of Nearly Monodisperse CdE (E=S, Se, Te) Semiconductor Nanocrystallites", J. Amer. Chem. Soc., 115, (1993), 8706-8715.

Nguyen, et al., "Controlling Interchain Interactions in Conjugated Polymers: The Effects of Chain Morphology on Exciton-Exciton Annihilation and Aggregation in MEH-PPV Filmes", J. Phys. Chem. B, 104, (2000), 237-255.

Nguyen, et al., "Improving the Performance of Conjugated Polymer-Based Devices by Control of Interchain Interactions and Polymer Film Morphology", Appl. Phys. Lett., 76, (2000), 2454-2456.

Peumans, et al., "Small Molecular Weight Organic Thin-Film Photodetectors and Solar Cells", J. Appl. Phys. 93, (2003), 3693-3723.

Rong, H., et al., "A Continuous-Wave Raman Silicon Laser", Nature, 433(7027), (2005), 725-728.

Sargent, E. H., "Infrared Quantum Dots", Advanced Materials, vol. 17, (2005), 515-522.

Sargent, E. H., "Towards CMOS-compatible, solution-processed quantum dot nanocrystal optical sources, modulators, detectors, and optical signal processing elements across the extended communications band 1200-1700 nm", Group IV Photonics, First IEEE International Conference on Hong Kong, China Sep. 29-Oct. 1, 2004, Piscataway, NJ, USA, IEEE, US, XP010782181, ISBN: 0-7803-8474-1, (Sep. 29, 2004), 52-54.

Schlamp, et al., "Improved Efficiencies in Light Emitting Diodes Made with CdSe(CdS) Core/Shell Type Nanocrystals and Semiconducting Polymer", J. Appl. Phys., 82, (1997), 5837-5842.

Solomeshch, O., et al., "Optoelectronic properties of polymer-nanocrystal composites active at near-infrared wavelengths", Journal of Applied Physics, vol. 98, XP002451932, USA, (2005), 074310-1-074310-6.

Steckel, et al., "1.3um to 1.55um Tunable Electroluminescence from PbSe Quantum Dtos Embedded Within an Organic Device", Adv. Mater. 15, (2003), 1862-1866.

Stok, et al., "Lighting the Local Area: Optical Code-Division Multiple Access and Quality of Service Provisioning", IEEE Network 14, (Nov./Dec. 2000), 42-46.

Takada, Shunji, et al., "CMOS Image Sensor with Organic Photoconductive Layer Having Narrow Absorption Band and Proposal of Stack Type Solid-State Image Sensors", Sensors, Cameras, and Systems for Scientific/Industrial Applications, VII, edited by Morley M. Blouke, Proc. of SPIE-IS&T Electronic Imaging, SPIE vol. 6068, 6068A, (2006), 6068A-1-6068A-8.

Tessler, N., et al., "Efficient near-infrared polymer nanocrystals light-emitting diodes", Science, vol. 295, (2002), 1506-1508.

Wang, et al., "Photoconductivity of CdS Nanocluster-Doped Polymers", Chem. Phys. Lett., 200, (1992), 71-75.

Warner, J. H., et al., "Controlling PbS noncrystal aggregation in conducting polymers", Nanotechnology, No. 16, XP002451930, UK, (2005), 2381-2384.

Wei, et al., "Effect of crystalline microstructure on the photophysical performance of polymer/perylene composite films", Chinese Physics, 12(4), (Apr. 2003), 426-432.

Wessels, J.M., et al., "Optical and electrical properties of three-dimensional interlinked gold nanoparticles assemblies", Journal of the American Chemical Society, vol. 126, (2004), 3349-3356.

Yoshino, et al., "Near IR and UV Enhanced Photoresponse of C60-doped Semiconducting Polymer Photodiode", Adv. Mater. 11, (1999), 1382-1385.

Yu, D., et al., "n-Type Conducting CdSe Nanocrystals Solids", Science, vol. 300, (2003), 1277-1280.

Zhao, X., et al., "Synthesis and optical properties of thiol-stabilised PbS nanocrystals", Langmuir, vol. 21, XP002451929, (2005), 1086-1090.

"U.S. Appl. No. 13/226,533, Response filed May 24, 2012 to Non Final Office Action mailed Feb. 29, 2012", 10 pgs.

* cited by examiner

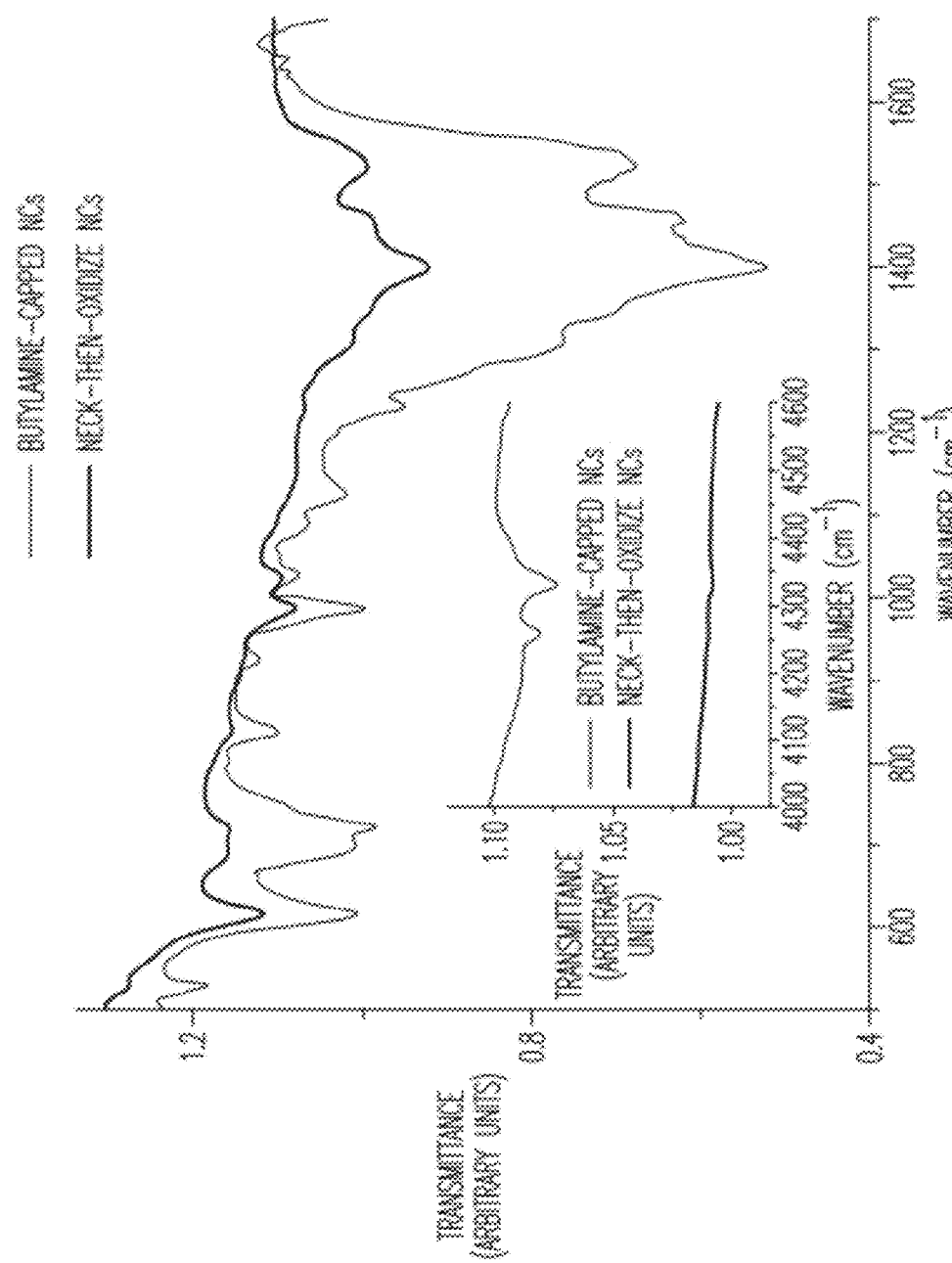

METHODS OF MAKING QUANTUM DOT FILMS

CROSS-REFERENCE TO RELATED APPLICATIONS

This application is a continuation of U.S. patent application Ser. No. 12/780,026, filed May 14, 2010, which is a divisional patent application of U.S. patent application Ser. No. 11/509,318, filed Aug. 24, 2006, now issued as U.S. Pat. No. 7,746,681, which claims the benefit of priority under 35 U.S.C. §119(e) of U.S. Provisional Application Ser. No. 60/710,944, filed Aug. 25, 2005, and which is also a continuation-in-part of U.S. application Ser. No. 11/327,655, filed Jan. 9, 2006, which claims priority from U.S. Provisional Application Ser. No. 60/641,766, filed Jan. 7, 2005, all of which are incorporated herein by reference in their entireties.

This application is also related to the following applications:

U.S. patent application Ser. No. 11/510,510, filed on Aug. 24, 2006, and entitled "Quantum Dot Optical Devices with Enhanced Gain and Sensitivity and Methods of Making Same," now issued as U.S. Pat. No. 7,773,404;

U.S. patent application Ser. No. 11/510,263, filed on Aug. 24, 2006, and entitled "Electronic and Optoelectronic Devices with Quantum Dot Films," now issued as U.S. Pat. No. 7,742,322;

U.S. patent application Ser. No. 11/108,900, filed Apr. 19, 2005 and entitled "Optically Regulated Optical Emission Using Colloidal Quantum Dot Nanocrystals," now issued as U.S. Pat. No. 7,326,908; and U.S. Provisional Application Ser. No. 60/563,012, filed Apr. 19, 2004 and entitled "Multi-Color Optical and Infrared Emission Using Colloidal Quantum Nanocrystals."

BACKGROUND

1. Field of the Invention

The present invention generally relates to optical and electronic devices including nanocrystals, such as quantum dots.

2. Description of Related Art

Many systems currently used for short-wavelength infrared (SWIR) photodetection and imaging are achieved through epitaxial growth of compound semiconductors such as InGaAs, or chemical bath growth of polycrystalline PbS or PbSe. These techniques can result in exceptionally sensitive detectors—normalized detectivity, D*, as high as $8 \times 10^{10}$ Jones from PbS at room temperature for example—but their deposition is generally incompatible with established silicon integrated circuit fabrication techniques. In such systems a silicon electronic read-out array and an infrared-sensitive photo detector array are fabricated separately. This non-monolithic process then necessitates a complex assembly procedure, resulting in low yield, poor resolution (e.g., at least 10×lower pixel count than a low-cost commercial silicon camera), and high cost (e.g., at least 100× greater than a silicon camera).

SWIR photodetection and imaging may also be achieved using quantum dots as a photosensitive material; however, imaging systems using quantum dots typically have relatively low gains and sensitivities. Some examples of imaging systems that utilize quantum dots, and applications thereof, may be found in the incorporated references given below.

A schematic of a ligand-capped QD nanocrystal is illustrated in FIG. 1. The QD includes a core 100, which includes a highly crystalline semiconductor region of relatively small size, e.g., from about 1-10 nm, for example about 5 nm as shown in the figure. The core is typically highly or may even be perfectly crystalline, is known to have a substantially homogeneous structure and composition. The QD is surrounded by a plurality of ligands 120 attached to its outer surface. Specifically, each ligand 120 includes a long chain, represented by the jagged line, and an end functional group 150, represented by the triangle, which connects the ligand to the outer surface of the QD.

The fabrication in solution of QDs, stabilized using suitable ligands, and typical QD characteristics such as size-tunable absorbance and emission are known. Solution-fabricated QDs may be referred to as "colloidal," as compared with epitaxially-grown (e.g., Stranski-Krastanov-mode grown) or otherwise deposited QDs. Further details may be found in the incorporated references included below.

SUMMARY

The inventions, embodiments of which are described here, have a number of aspects including an imaging system, a focal plane array which includes an optically sensitive layer formed on an underlying circuit (e.g., a read-out structure which includes an integrated circuit) patterned to measure and relay optical signals, electronic signals, or both, on a pixel-by-pixel basis, where the signal is indicative of light absorbed in the medium from which the focal plane array is made. The circuit achieves multiplexing of the values read from individual pixels into row or columns of data, carried by electrodes. Subsequent layers, typically processed from the solution phase, which, with appropriate interfacing, sensitize the underlying focal plane array to become responsive to the wavelengths absorbed by these new layers. Their resultant electronic signals are registered and relayed using the underlying chip.

A range of structures can be formed on an integrated circuit of the read-out structure that enable the medium from which the chip itself is made, and also the optically sensitive layer, to be electronically biased and their resultant signals read by the circuit.

The invention provides a range of solution-processed optically sensitive layers that would lie atop the underlying chip. In a particular embodiment, the invention provides a method of sensitizing a silicon CCD (charge-coupled device) or CMOS focal plane array into the infrared spectral range using thin films which include spin-coated quantum dot nanocrystals. The invention includes a method of sensitizing a prefabricated focal plane array sensitive into the visible and infrared spectral ranges using spin-coated quantum dot nanocrystals and semiconducting polymers.

Thus, efficient, high-detectivity photodetectors based on solution-processed quantum dots with subsequent solution-phase and vapor-phase thermal processing have been produced. Also manufacturaable are highly sensitive photodetectors based on a combination of two (or more) types of solution-processed quantum dots, each composed of a distinct semiconductor material. In addition, efficient, high-detectivity photo detectors based on a combination of differently-treated solution-processed quantum dots may be constructed.

In some embodiments, the imaging devices are efficient photoconductive optical detectors active in the x-ray, ultraviolet, visible, short-wavelength infrared, long-wavelength infrared regions of the spectrum, and are based on solution-processed nanocrystalline quantum dots. Certain of these embodiments have the potential to be used in creating low-cost infrared imaging systems for security, night vision, and missile tracking applications, while other embodiments have the potential to be used in other kinds of imaging systems.

In other aspects, the inventions include methods and structures for forming useful QD structures, typically in the form of a film. The methods include fabricating a plurality of nanocrystals, each having a core and an outer surface with a plurality of first ligands having a first length being attached to the outer surface. The ligands attached to the outer surface of the nanocrystals are replaced with a plurality of second ligands having a second length less than the first length. A film of ligand-exchanged nanocrystals is formed, such that at least a portion of the ligand-exchanged nanocrystals are adjacent at least one other ligand-exchanged nanocrystal. The second ligands attached to the outer surfaces of the nanocrystals of the film of ligand-exchanged nanocrystals are removed—either partially, substantially, or completely—so as to bring the outer surfaces of adjacent nanocrystals into closer proximity, and even to cause "necking" or touching between the nanocrystals. The cores of adjacent nanocrystals can be further fused to form an electrical network of fused nanocrystals. The film can have defect states on the outer surfaces where the cores are not fused, formed, for example, through oxidation. The film thus produced can be used as part of a sensor, or formed over a device used as part of a sensor.

In other aspects, the inventions include devices with improved properties. In one embodiment, a device is provided with a noise equivalent exposure (NEE) of less than $10^{-11}$ J/cm$^2$ at wavelengths of 400 nm to 800 nm, and further less than $10^{-10}$ J/cm$^2$ at wavelengths of 400 nm to 1400 nm. In other embodiments, a device has a responsivity as measured in A/W of between about 1 and about 1,000, or even between about 1 and about 10,000, for example at least 100, or preferably more than 1000, or still more preferably at greater than 10,000. The responsivity is a function in part of the bias voltage applied, with a greater responsivity with higher bias. In still other embodiments, a device provides a substantially linear response over 0-10V with a bias applied across a distance of 0.2 to 2 microns width or gap. A device can be produced with a combination of these properties.

Under one aspect, a device includes an integrated circuit having an array of conductive regions; and an optically sensitive material over at least a portion of the integrated circuit and in electrical communication with at least one conductive region of the array of conductive regions.

One or more embodiments include one or more of the following features. The optically sensitive layer includes an array of islands of optically sensitive material, wherein a plurality of the islands overlay a corresponding plurality of the conductive regions. The integrated circuit includes three-dimensional features and wherein the optically sensitive material conforms to at least a portion of said three-dimensional features. Further including an electrode overlaying and in electrical communication with at least a portion of the optically sensitive layer. The electrode is at least partially transparent. The electrode includes at least one of a band-pass and a band-block material. The conductive regions are arranged in one or more rows over the integrated circuit. The conductive regions are further arranged in one or more columns over the integrated circuit. The conductive regions are arranged in a plurality of rows and columns over the integrated circuit. The integrated circuit includes a flexible substrate and is formed in a non-planar shape. The integrated circuit includes at least one of a semiconducting organic molecule and a semiconducting polymer. The optically sensitive layer includes a plurality of nanocrystals. The optically sensitive layer includes a plurality of fused nanocrystals, each nanocrystal having a core and an outer surface. The outer surfaces of the fused nanocrystals are at least partially free of ligands. The optically sensitive layer includes a continuous film having nanoscale features, the nanoscale features comprising an interconnected network of fused nanocrystals, wherein substantially each fused nanocrystal includes a core in direct physical contact and electrical communication with the core of at least one adjacent nanocrystal. The continuous film is substantially inorganic. The continuous film includes ligands on portions of the outer surface excluding portions where the nanocrystals have been fused. The outer surface of substantially each fused nanocrystal includes a material having a different composition from the core. The outer surface of substantially each fused nanocrystal includes oxidized core material. The outer surface of substantially each fused nanocrystal includes semiconductor material. The outer surface of substantially each fused nanocrystal includes at least one defect state. The optically sensitive layer includes an optically active polymer. The optically active polymer includes at least one of MEH-PPV, P3OT, and P3HT. The conductive regions include pixel regions, and wherein the integrated circuit includes a readout circuit capable of activating a pixel region by applying an electrical signal to a control lead in communication with that pixel region so that current flows through the optically sensitive layer and the pixel region, wherein the amount of current that flows through the optically sensitive layer and the pixel region is related to a number of photons received by the optically sensitive layer. The integrated circuit includes a CMOS active pixel. The integrated circuit includes a CCD pixel. During operation an amount of current flowing in the optically sensitive layer is substantially linearly related to an amount of light received by the optically sensitive layer over at least a portion of its intended operating range. The optically sensitive layer has a photoconductive gain of between about 1 and 1,000 A/W, or between about 1 and 10,000 A/W, or at least about 10,000 A/W, or between about 100 and 10,000 A/W. The optically sensitive layer has a noise equivalent exposure of less than about $10^{-11}$ J/cm$^2$ between the wavelengths of 400 nm and 800 nm, or between about $10^{-11}$ and $10^{-12}$ J/cm$^2$ between the wavelengths of 400 nm and 800 nm, or less than about $10^{-10}$ J/cm$^2$ between the wavelengths of 400 nm and 1400 nm, or less than about $10^{-11}$ J/cm$^2$ in at least a portion of the spectrum between the wavelengths of 10 nm and 5 µm, or less than about $10^{-12}$ J/cm$^2$ in at least a portion of the spectrum between the wavelengths of 10 nm and 5 µm. The optically sensitive layer has an electrical resistance of greater than about 25 k-Ohm/square. The optically sensitive layer has a carrier mobility of between about 0.001 and about 10 cm$^2$/Vs, or between about 0.01 and about 0.1 cm$^2$/Vs, or greater than about 0.01 cm$^2$/Vs.

Under another aspect, a method of making a device includes providing an integrated circuit having a top surface and an array of electrodes located therein, at least some of the electrodes being arranged to convey signals from the array to an output; and solution-depositing an electrically active layer onto at least a portion of the top surface of the integrated circuit such that it is in direct and continuous electrical contact with said at least a portion.

One or more embodiments include one or more of the following features. Solution-depositing the electrically active layer includes spray-coating, dip-casting, drop-casting, evaporating, blade-casting, or spin-coating the electrically active layer onto the top surface of the integrated circuit. Patterning the electrically active layer. Patterning includes lithographically patterning after it is solution-deposited. Patterning includes self-assembling the electrically active layer onto one or more selected regions of said at least a portion.

Patterning includes depositing the electrically active layer over protrusions and trenches in the integrated circuit and then planarizing the electrically active layer to remove portions of the layer from the protrusions and leaving portions of the layer in the trenches. The array of electrodes includes three-dimensional features and the electrically active layer conforms to the three-dimensional features. Solution-depositing the electrically active layer includes solution-depositing nanocrystals, each nanocrystal having a core and an outer surface. The nanocrystals have a size between about 1-10 nm. The nanocrystals include nanocrystals of different compositions. The nanocrystals include nanocrystals of different sizes. The nanocrystals are substantially monodisperse. The nanocrystals include at least one of PbS, InAs, InP, PbSe, CdS, CdSe, $In_xGa_{1-x}As$, (Cd—Hg)Te, ZnSe(PbS), ZnS (CdSe), ZnSe(CdS), PbO(PbS), and $PbSO_4$(PbS). Also fusing at least a portion of the nanocrystals to each other after solution-depositing them. Fusing at least a portion of the nanocrystals to each other includes removing ligands from the outer surface of said at least a portion of the nanocrystals. Fusing at least a portion of the nanocrystals to each other includes removing at least a portion of the ligands from the outer surface of said at least a portion of the nanocrystals; and annealing the nanocrystals so as to fuse the cores of said at least a portion of the nanocrystals to other cores of said at least a portion of the nanocrystals Annealing the nanocrystals removes at least a portion of the ligands from the outer surface of said at least a portion of the nanocrystals. Annealing the nanocrystals includes heating them to a temperature between about 150° C. and about 450° C. Annealing the nanocrystals includes heating them to a temperature between about room temperature and about 150° C. Also performing a ligand-exchange on at least a portion of the nanocrystals before solution-depositing them so as to provide relatively short ligands on said at least a portion of the nanocrystals. The relatively short ligands include at least one of pyridine, allylamine, methylamine, ethylamine, propylamine, butylamine, octylamine, and pyrrolidine ligands. The electrically active layer is also optically sensitive. At least some of the electrodes of the integrated circuit are configured to define optical pixels which are read by others of the electrodes. Also selecting a wavelength region of the electromagnetic spectrum in which the electrically active layer is intended to operate. Selecting the wavelength region includes selecting nanocrystals of a particular size and including them in the electrically active layer. The wavelength region includes at least one of the x-ray, infrared, visible, and ultraviolet regions of the electromagnetic spectrum. The electrically active layer includes a semiconducting polymer. The semiconducting polymer includes at least one of MEH-PPV, P3OT, and P3HT. Also providing at least one electrode over and in electrical contact with at least a portion of the electrically active layer. The at least one electrode is at least partially optically transparent. The at least one electrode includes at least one of a bandpass filter and a bandblock filter. The at least one electrode includes at least one of indium tin oxide, indium oxide, tungsten oxide, aluminum, gold, platinum, silver, magnesium, copper, and combinations and layer structures thereof. Also providing an anti-reflection coating over the electrically active layer. Also providing a protective coating over the electrically active layer for protecting the layer from one or more environmental influences. Also providing an optical filter coating over the electrically active layer, wherein the optical filter includes at least one of a bandpass filter and a bandstop filter. The integrated circuit includes a flexible substrate and is formed in a non-planar shape. The integrated circuit includes at least one of a semiconducting organic molecule and a semiconducting polymer. The integrated circuit includes at least one of silicon, silicon-on-insulator, silicon-germanium, indium phosphide, indium gallium arsenide, gallium arsenide, glass, and polymer.

Under another aspect, a device includes a plurality of electrodes; and an optically sensitive layer between, in contact with, and in electrical communication with the electrodes, the electrodes for providing a signal indicative of radiation absorbed by the optically sensitive layer, the optically sensitive layer providing a photoconductive gain of at least about 100 A/W.

One or more embodiments include one or more of the following features. The optically sensitive layer has a photoconductive gain of at least about 1000 A/W. The optically sensitive layer has a photoconductive gain of at least about 10,000 A/W. The optically sensitive layer has a photoconductive gain of between about 100 and 10,000 A/W.

Under another aspect, a device includes a plurality of electrodes; and an optically sensitive layer between, in contact with, and in electrical communication with the electrodes, the electrodes for providing a signal indicative of radiation absorbed by the optically sensitive layer, wherein the optically sensitive layer has a noise equivalent exposure of less than about $10^{-11}$ $J/cm^2$ at wavelengths between 400 nm and 800 nm.

One or more embodiments include one or more of the following features. The optically sensitive layer has a noise equivalent exposure of between about $10^{-11}$ and $10^{-12}$ $J/cm^2$ at wavelengths between 400 nm and 800 nm. The optically sensitive layer has a noise equivalent exposure of less than about $10^{-10}$ J/cm2 at wavelengths between 400 and 1400 nm. The optically sensitive layer has a photoconductive gain of at least about 100 A/W. The optically sensitive layer has a photoconductive gain of at least about 1000 A/W. The optically sensitive layer has a photoconductive gain of at least about 10,000 A/W.

Under another aspect, a device includes a plurality of electrodes; and an optically sensitive layer between, in contact with, and in electrical communication with the electrodes, the electrodes for providing a signal indicative of radiation absorbed by the optically sensitive layer, wherein the optically sensitive layer has a carrier mobility of greater than about 0.001 $cm^2/Vs$.

One or more embodiments include one or more of the following features. The optically sensitive layer has a carrier mobility of between about 0.01 $cm^2/Vs$ and about 0.1 $cm^2/Vs$. The optically sensitive layer has a carrier mobility of up to about 10 $cm^2/Vs$.

Under another aspect, a method of forming a nanocrystalline film includes fabricating a plurality of nanocrystals, the nanocrystals having a core and an outer surface, a plurality of first ligands having a first length being attached to the outer surface; exchanging the plurality of first ligands attached to the outer surface of the nanocrystals for a plurality of second ligands having a second length and having a different chemical composition than the plurality of first ligands; forming a film of ligand-exchanged nanocrystals, wherein at least a portion of the ligand-exchanged nanocrystals are adjacent at least one other ligand-exchanged nanocrystal; removing the second ligands attached to the outer surfaces of the nanocrystals of the film of ligand-exchanged nanocrystals so as to bring the outer surfaces of adjacent nanocrystals into closer proximity; and fusing the cores of adjacent nanocrystals so as to form an electrical network of fused nanocrystals.

One or more embodiments include one or more of the following features. Fabricating a plurality of nanocrystals includes forming the nanocrystals in a substantially inert environment so as to substantially prevent the formation of defect states on the outer surfaces of the nanocrystals. The second length is less than the first length. The first ligands each include a carbon chain greater than about 10 carbons long. The second ligands each include a carbon chain between about 1-10 carbons long. The second ligands have a length less than about 1 nm. The second ligands include at least one of pyridine, allylamine, methylamine, ethylamine, propylamine, butylamine, octylamine, and pyrrolidine. The second ligands bind to the outer surface of the nanocrystals with an affinity that is at least as large as an affinity with which the first ligands bind to the outer surface of the nanocrystals. Exchanging the plurality of first ligands for a plurality of second ligands includes precipitating the fabricated nanocrystals; washing the precipitated nanocrystals; and dispersing the washed nanocrystals in a solution comprising the second ligands. Forming the film of ligand-exchanged nanocrystals includes solution-depositing the ligand-exchanged nanocrystals onto a substrate. Solution-depositing the ligand-exchanged nanocrystals includes spray-coating, dip-casting, drop-casting, evaporating, blade-casting, or spin-coating the ligand-exchanged nanocrystals onto the substrate. Removing the second ligands includes volatilizing the second ligands during the step of fusing the cores of adjacent nanocrystals. Volatilizing the second ligands causes a relatively small change in the volume of the film of ligand-exchanged nanocrystals. The volume changes by less than about 30% during ligand removal. Removing the second ligands includes performing a chemical transformation of the ligands so as to remove them. Removing the second ligands includes soaking the film of ligand-exchanged nanocrystals in a solvent that dissociates the second ligands from the outer surface of the nanocrystals but which does not substantially dissociate the nanocrystals of the film from each other. Removing the second ligands further includes maintaining the nanocrystals in a substantially inert environment. The solvent includes methanol. Fusing the cores of adjacent nanocrystals includes annealing the film of ligand-exchanged nanocrystals. Fusing the cores of adjacent nanocrystals forms a substantially inorganic film having nanoscale features. The nanoscale features have about the same size and shape of the individual nanocrystals before they were fused. Fusing the cores of adjacent nanocrystals to an extent that the nanocrystals substantially maintain their individual properties but are joined by regions through which current readily flows. A central absorption wavelength of the nanocrystals changes by less than about 10% when fused to one or more adjacent nanocrystals. Fusing the cores of adjacent nanocrystals includes annealing the nanocrystals at a temperature of between 150° C. and 450° C. Fusing the cores of adjacent nanocrystals includes annealing the film at a temperature of between room temperature and 150° C. Modifying the outer surfaces of the fused nanocrystals. Modifying the outer surfaces includes oxidizing the fused nanocrystals. Modifying the outer surfaces includes depositing a semiconductor shell on the fused nanocrystals. Modifying the outer surface includes forming one or more defect states on the outer surfaces of the fused nanocrystals.

Under another aspect, a method of forming a device includes forming a film of nanocrystals, the nanocrystals having a core and an outer surface, a plurality of ligands being attached to the outer surface, at least a portion of the nanocrystals being in physical contact with at least one adjacent nanocrystals; removing the ligands from at least a portion of the nanocrystals; annealing the film of nanocrystals so as to fuse the cores of the nanocrystals to the cores at least one adjacent nanocrystal and thus form an electrical network of fused nanocrystals; and providing first and second electrodes in spaced relation and in electrical communication with first and second portions of the electrical network of fused nanocrystals.

One or more embodiments include one or more of the following features: Also substituting a plurality of said ligands with a plurality of shorter ligands. Substituting a plurality of said ligands with a plurality of shorter ligands decreases an effective distance between at least one nanocrystals and at least one adjacent nanocrystal. Also altering the composition of the outer surfaces of the nanocrystals. Also creating at least one defect state on the outer surface of at least some of the fused nanocrystals and not creating a defect state in the regions where one nanocrystal core is fused to another. Creating at least one defect state on substantially each fused nanocrystal includes oxidizing the electrical network of fused nanocrystals. The at least one defect state includes at least one trap state for a hole during operation of the optical device. Forming the film of nanocrystals on the substrate includes solution-depositing colloidal nanocrystals on the substrate. Solution-depositing colloidal nanocrystals includes spray-coating, dip-casting, drop-casting, evaporating, blade-casting, or spin-coating the nanocrystals onto the substrate. Providing first and second electrodes in spaced relation and in electrical communication with the electrical network of fused nanocrystals includes forming the first and second electrodes on a substrate and subsequently performing steps (a)-(c). The first and second electrodes are spaced from each other by between about 0.2 and 2 μm. Providing the first and second electrodes having parallel orientation relative to each other. Providing the first and second electrodes being interdigitated with one another. Providing first and second electrodes in spaced relation and in electrical communication with the electrical network of fused nanocrystals includes forming the first electrode on the substrate, subsequently performing steps (a)-(c), and subsequently providing the second electrode over the electrical network of fused nanocrystals. The second electrode includes at least one of aluminum, gold, platinum, silver, magnesium, copper, indium tin oxide (ITO), tin oxide, tungsten oxide, and combinations and layer structures thereof. The second electrode is at least partially optically transparent. The second electrode includes at least one of a bandpass filter and a bandblock filter.

Under another aspect, a method of forming a nanocrystalline film from a plurality of nanocrystals, the nanocrystals having a core and an outer surface, a plurality of ligands being attached to the outer surface, includes forming a film of ligand-attached nanocrystals, wherein at least a portion of the ligand-attached nanocrystals are adjacent at least one other ligand-attached nanocrystal; removing the ligands attached to the outer surfaces of the nanocrystals of the film of ligand-exchanged nanocrystals; and fusing the cores of adjacent nanocrystals so as to form an electrical network of fused nanocrystals.

One or more embodiments include one or more of the following features. The ligands each include a carbon chain between about 1-10 carbons long. The ligands have a length less than about 1 nm. Forming the film of ligand-attached nanocrystals includes solution-depositing the ligand-exchanged nanocrystals onto a substrate. Solution-depositing the ligand-exchanged nanocrystals includes spray-coating, dip-casting, drop-casting, evaporating, blade-casting, or spin-coating the ligand-exchanged nanocrystals onto the substrate. Removing the ligands includes volatilizing the ligands during the step of fusing the cores of adjacent nanocrystals. Removing the ligands includes soaking the film of ligand-attached nanocrystals in a solvent that dissociates the ligands from the outer surface of the nanocrystals but which does not substantially dissociate the nanocrystals of the film from each other. Removing the ligands further includes maintaining the nanocrystals in a substantially inert environment. Fusing the cores of adjacent nanocrystals includes annealing the film of ligand-attached nanocrystals. Fusing the cores of adjacent nanocrystals includes annealing the nanocrystals at a temperature between room temperature and about 450° C. Also modifying the outer surfaces of the fused nanocrystals. Modifying the outer surfaces includes oxidizing the fused nanocrystals. Modifying the outer surfaces includes depositing a semiconductor shell on the fused nanocrystals. Modifying the outer surface includes forming one or more defect states on the outer surfaces of the fused nanocrystals.

Under another aspect, a film includes a network of fused nanocrystals, the nanocrystals having a core and an outer surface, wherein the core of at least a portion of the fused nanocrystals is in direct physical contact and electrical communication with the core of at least one adjacent fused nanocrystal, and wherein the film has substantially no defect states in the regions where the cores of the nanocrystals are fused.

One or more embodiments include one or more of the following features. The outer surface of at least a portion of the fused nanocrystals includes a material of different composition than the core. The outer surface includes oxidized core material. The outer surface includes semiconductor material. The outer surface includes at least one defect state. The film is substantially inorganic. The film is substantially free of ligands on the outer surfaces of the fused nanocrystals. The network of fused nanocrystals defines a conductive electrical network. The network of fused nanocrystals has an electrical resistance of at least about 25 k-Ohm/square. The network of fused nanocrystals has a carrier mobility of between about 0.001 and about 10 cm$^2$/Vs. The network of fused nanocrystals has a carrier mobility of between about 0.01 and about 0.1 cm$^2$/Vs. The network of fused nanocrystals is optically sensitive. The network of fused nanocrystals has a substantially linear responsivity to irradiation in at least a portion of the electromagnetic spectrum. The film is disposed on a substrate. The substrate is flexible and formed in a non-planar shape. The substrate includes an integrated circuit, at least some components of which are in electrical communication with the film. The substrate includes at least one of a semiconducting organic molecule, a semiconducting polymer, and a crystalline semiconductor. The film has an electrical resistance of at least about 25 k-Ohm/square. The network of fused nanocrystals includes fused nanocrystals of different compositions. The network of fused nanocrystals includes fused nanocrystals of different sizes. The fused nanocrystals are substantially monodisperse. The fused nanocrystals include at least one of PbS, InAs, InP, PbSe, CdS, CdSe, In$_x$Ga$_{1-x}$As, (Cd—Hg)Te, ZnSe(PbS), ZnS(CdSe), ZnSe(CdS), PbO(PbS), and PbSO$_4$(PbS). The film has an optical response to irradiation in at least one of the infrared, ultraviolet, x-ray, and visible regions of the electromagnetic spectrum. The optical response of the film is related to a size of the fused nanocrystals in the film. The fused nanocrystals have individual properties that vary by less than about 10% from the individual properties of unfused nanocrystals having the same size, shape, and composition as the fused nanocrystals.

Under another aspect, a device includes a film comprising a network of fused nanocrystals, the nanocrystals having a core and an outer surface, wherein the core of at least a portion of the fused nanocrystals is in direct physical contact and electrical communication with the core of at least one adjacent fused nanocrystal, and wherein the film has substantially no defect states in the regions where the cores of the nanocrystals are fused; and first and second electrodes in spaced relation and in electrical communication with first and second portions of the network of fused nanocrystals.

One or more embodiments include one or more of the following features. The film is substantially free of ligands attached to the outer surface of the fused nanocrystals. The outer surfaces of the fused nanocrystals include a material having a different composition than the core. The outer surfaces include at least one defect state. The at least one defect state includes at least one trap state for a hole during operation of the optical device. The outer surfaces include a semiconductor material. The outer surfaces include oxidized core material. The electrical network of fused nanocrystals provides a plurality of relatively low-resistance electrical paths from the first electrode to the second electrode. The film has an electrical resistance of at least about 25 k-Ohm/square. The electrical resistance of the film changes in response to irradiation by light. The electrical network of fused nanocrystals provides a plurality of electrical paths from the first electrode to the second electrode and at least some of those electrical paths undergo a change in electrical resistance in response to incident light. The film has a carrier mobility of between about 0.001 cm$^2$/Vs and about 10 cm$^2$/Vs. The film has a carrier mobility of between about 0.01 and cm$^2$/Vs and about 0.1 cm$^2$/Vs. The fused nanocrystals are substantially monodisperse. The fused nanocrystals include a plurality of a first type of fused nanocrystals and a plurality of a second type of fused nanocrystals. The core of substantially each of the first type of fused nanocrystals is in direct physical contact and electrical communication with the core of another of the first type of fused nanocrystals. The core of substantially each of the second type of fused nanocrystals is in direct physical and electrical communication with the core of another of the second type of fused nanocrystals. Each fused nanocrystal is of a size and composition to absorb at least one of infrared radiation, x-ray radiation, ultraviolet radiation, and visible radiation. The first and second electrodes are disposed on a substrate with the film therebetween. The first and second electrodes are substantially parallel to each other. The first and second electrodes are interdigitated. The first electrode is disposed on a substrate, the film is over the first electrode, and the second electrode is over the film. The first and second electrodes are spaced by about 0.2 µm to about 2 µm from each other.

BRIEF DESCRIPTION OF THE DRAWINGS

Embodiments of the invention will now be described, by way of example only, with reference to the accompanying drawings. The drawings are not necessarily to scale. For clarity and conciseness, certain features of the invention may be exaggerated and shown in schematic form. In the drawing:

FIG. 6D shows FTIR spectra of lead sulfide QDs with butylamine ligands before and after methanol wash.

DETAILED DESCRIPTION

Overview

Figure 1:
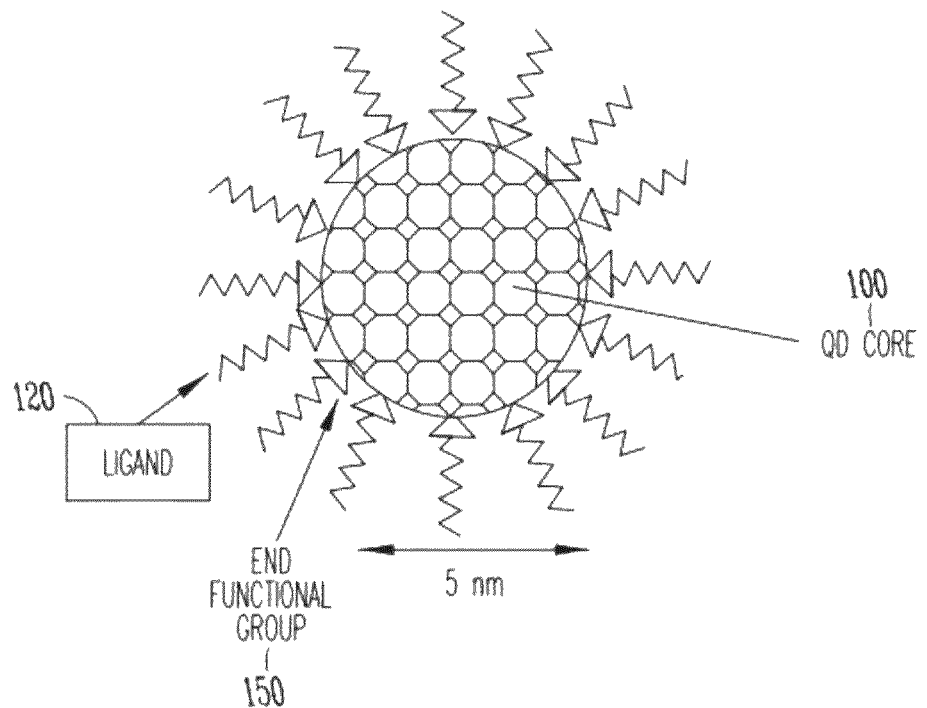
FIG. 1 shows a schematic of a known quantum dot nanocrystal.

The present invention provides quantum dot (QD) devices and methods of making devices. Many embodiments are optical devices with enhanced gain and sensitivity, and which can be used in optical and infrared (IR) imaging applications, photovoltaic applications, among other applications. The term "quantum dot" or "QD" is used interchangeably herein with the term "nanocrystal," and it should be understood that the present invention is not limited exclusively to quantum dots but rather to any "nanoscale" crystalline material.

Some embodiments of the QD optical devices are single image sensor chips that have a plurality of pixels, each of which includes a QD layer that is light sensitive, e.g., optically active, and at least two electrodes in electrical communication with the QD layer. The current and/or voltage between the electrodes is related to the amount of light received by the QD layer. Specifically, photons absorbed by the QD layer generate electron-hole pairs, generating a current and/or voltage. By determining the current and/or voltage for each pixel, the image across the chip can be reconstructed. The image sensor chips have a high sensitivity, which can be beneficial in low-light applications; a wide dynamic range allowing for excellent image detail; and a small pixel size, which to a large extent is limited by currently available CMOS techniques such as lithography. The responsivity of the sensor chips to different optical wavelengths is also tunable by changing the size of the QDs in the device, by taking advantage of the quantum size effects in QDs. The pixels can be made as small as 1 micron square or less.

In many embodiments, the optically sensitive QD layer includes a plurality of QDs that have been specially processed to give the layer an enhanced gain and sensitivity as compared with conventional silicon-based layers as well as other kinds of QD layers, such as those described in the incorporated patent references. Specifically, a plurality of QDs are fabricated using well-known techniques, and typically include a core as well as an outer surface that includes a plurality of ligands. The ligands are exchanged for shorter, volatile ligands, and then the ligand-exchanged QDs are solution-deposited onto a substrate to form a QD precursor layer. The substrate itself may include one or more electrodes, or the electrodes may be deposited in a later step. Subsequently, the short ligands are removed from the QD precursor layer. This brings the QDs in the QD precursor layer into very close contact, so that at least some of the QDs contact their neighbors. This contact between QDs may be referred to as "necking" Subsequently, the necked QD layer is annealed, which fuses the necked QDs together. The QD precursor layer is typically maintained in an inert atmosphere after ligand removal, so that the outer surfaces of the individual QDs do not oxidize until annealing is complete.

While two given fused QDs in the annealed QD layer retain a large portion of their original shape, and thus remain individually recognizable, after annealing the QDs are no longer physically distinct from each other. Instead, the cores of the QDs together form a continuous electrical path. Thus, if many adjacent QDs neck, during annealing those necked QDs fuse to form an electrical network with a physical extent that is substantially greater than that of the individual QDs, and through which current will readily flow. For example, the fused QD film may have a macroscopic extent, though the QDs themselves are nanoscopic. In some embodiments, the finished QD layer after ligand removal, necking, and annealing, can essentially be considered a continuous inorganic film having nanoscale features. The general shapes of the individual QDs may still be recognizable, but their cores form a continuous electrical network that is mechanically robust. For example, a micrograph of the finished QD layer would show the general shape and size of the individual QDs from which the layer is formed, as well as robust joints between many adjacent QDs.

In many embodiments, the fused QD layer is subsequently processed to modify its outer surfaces. For example, a material such as a semiconductor shell can be coated on the outer surfaces of the fused quantum dots. Or, for example, defect states can be formed on the exposed outer surfaces of the QDs, e.g., by oxidizing the fused QDs layer. These defect states effectively trap holes generated by photons, so that they recombine with electrons far less readily and thus greatly enhance the amount of current that a given photon generates in the finished QD layer, i.e., greatly enhance the photoconductive gain of the device. The fused QD cores, and the juncture between them, will generally not have defect states, so current will flow readily between them, in certain embodiments.

Figure 2:
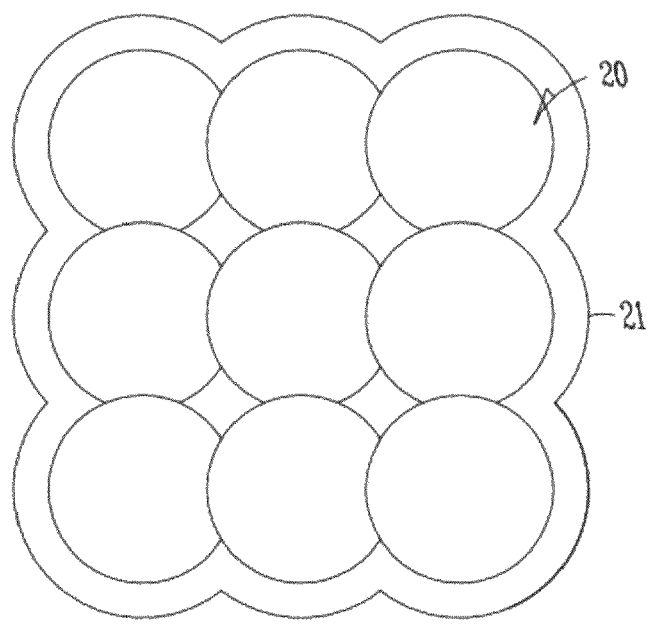
FIG. 2 shows a two-dimensional schematic of a layer of fused quantum dots.

FIG. 2 shows a two-dimensional representation of a portion of a QD layer. The layer includes a continuous network of fused QD cores 20, having outer surfaces 21 that are a different composition than that in the core, e.g., oxidized core material, or a different kind of semiconductor. The individual QD cores in the film are in intimate contact, but continue to exhibit many of the normal properties of individual quantum dots. For example, a lone (unfused) quantum dot has a well-characterized central absorbance wavelength that arises from quantum effects related to its tiny size, e.g., 1-10 nm. The central absorbance wavelength of the fused QDs in the film is not significantly shifted from their central absorbance wavelength before fusing. For example, their central absorbance wavelength may change by about 10% or less when fused. Thus, the QDs in the film retain their quantum effects, despite the fact that they may be an integral part of a macroscopic structure.

Current is not generally though of as "flowing" through a lone (unfused) QD; instead, electrons simply occupy well-known quantum energy states in the CD core. If two lone (unfused) QDs are brought near each other, current can "flow" between them by electron "hopping" between the QDs, which has a well-known dynamic. In contrast, current does readily flow between fused QD cores, even though the cores themselves generally retain their quantum energy states. Because the cores are in contact, electrons can easily move between them. This aspect of QD fusing typically provides a carrier mobility of between about 0.001-10 $cm^2/Vs$, in some embodiments between about 0.01-0.1 $cm^2/Vs$, for example greater than 0.01 $cm^2/Vs$, while at the same time not fusing the QDs to an extent that they lose their "identity," namely their individual characteristics that provide quantum confinement. A film of fused QDs typically also exhibits a a relatively low electrical resistance pathway, e.g., having a resistance above about 25 k-Ohm/square It is also possible to "overfuse" QDs, in which case they no longer exhibit many of the normal properties of individual quantum dots. In the overfused case, the cores of the QDs do not generally have their own quantum energy levels, but the energy levels are instead distributed over multiple QD cores. This results in a film with a very low electrical resistance, e.g., less than about 25 k-Ohm, but which in many ways is effectively a bulk semiconductor material. "Overfused" QDs can also be recognized experimentally as a relatively large shift (e.g., greater than about 10%) in a shift to the red (longer wavelengths) in their absorption and/or emission spectra.

In certain embodiments the QD layer is exceptionally light sensitive. This sensitivity is particularly useful for low-light imaging applications. At the same time, the gain of the device can be dynamically adjusted so that the device will not "saturate," that is, additional photons continue to provide additional useful information. Tuning of gain can be conveniently achieved by changing the voltage bias, and thus the resultant electric field, across a given device, e.g., a pixel. As discussed in greater detail below, photoconductive gain, and correspondingly the responsivity in A/W, varies approximately linearly with bias and field. Thus, in a given device, a bias of about 0.1 V may result in a gain of about 10, while a bias of about 10 V may result in a gain of about 100.

Some embodiments of QD devices include a QD layer and a custom-designed or pre-fabricated CCD or CMOS electronic read-out integrated circuit. CCD and CMOS electronic read-out circuits are readily commercially available at low cost. The QD layer is then formed directly onto the custom-designed or pre-fabricated CCD or CMOS electronic read-out integrated circuit. The QD layer may additionally be patterned so that it forms individual islands. Wherever the QD layer overlies the circuit, it continuously overlaps and contacts at least some of the features of the circuit. If the QD layer overlies three-dimensional features of the circuit, the QD layer conforms to those features. In other words, there is a substantially contiguous interface between the QD layer and the underlying CCD or CMOS electronic read-out integrated circuit. One or more electrodes in the CCD or CMOS circuit contact the QD layer and are capable of relaying information about the QD layer, e.g., the amount of light on it, to a readout circuit. The QD layer can be provided in a continuous manner to cover the entire underlying circuit, such as a readout circuit, or patterned. If in a continuous manner, the fill factor can approach about 100%, which is much greater than known CMOS pixels; with patterning, the fill factor is reduced, but can still be much greater than a typical 35% for a CMOS sensor.

In many embodiments, the QD optical devices are readily fabricated using standard CMOS techniques. For example, a layer of QDs can be solution-coated onto a prefabricated CCD or CMOS electronic read-out circuit using, e.g., spin-coating, which is a standard CMOS process, and optionally further processed with other CMOS-compatible techniques to provide the final QD layer for use in the device. Details of QD deposition and further processing are provided below. Because the QD layer need not require exotic or difficult techniques to fabricate, but can instead be made using standard CMOS processes, the QD optical devices can be made in high volumes, and with no significant increase in capital cost (other than materials) over current CMOS process steps.

Individual features and embodiments of QD devices, and methods of making same, will now be described in greater detail.

Electronic Read-Out Integrated Circuit

Figure 3A:
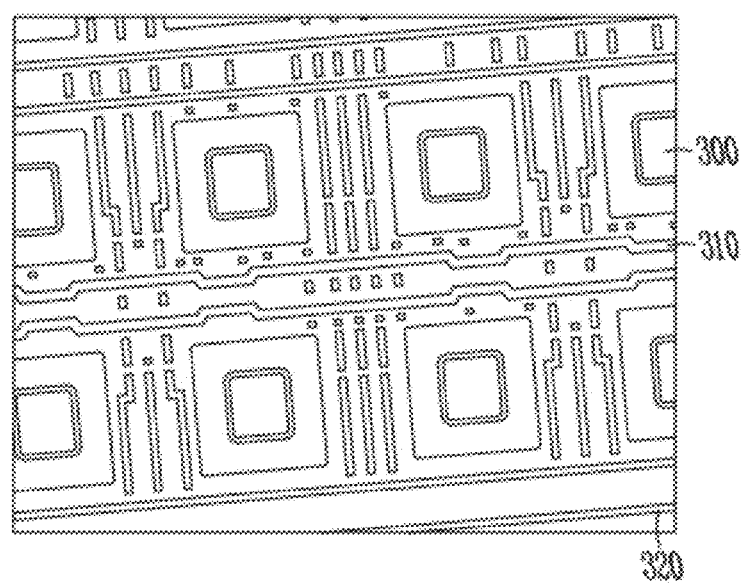
FIG. 3A shows an optical micrograph of a light sensitive layer formed on an electronic read-out chip.

FIG. 3A shows an optical micrograph of a light sensitive layer formed on a commercially available electronic read-out integrated circuit (ROIC) chip. In many embodiments, the light sensitive layer includes a plurality of QDs, as described in greater detail below. The light sensitive layer, e.g., the QD layer, overlays and conforms to the features of the underlying chip. As can be seen in FIG. 3A, the electronic read-out chip, e.g., a CCD or CMOS integrated circuit, includes a two-dimensional array of rows 310 and columns of electrodes 320. The electronic readout chip also includes a two-dimensional array of square electrode pads 300 which together with the overlying QD layer and other circuitry form a two-dimensional array of pixels. The row electrodes 310 and column electrodes 320 allow each pixel (including square electrode pad 300 and overlying QD layer) to be electronically read-out by a read-out circuit (not shown) that is in electrical communication with the electrodes. The resulting sequence of information from the ROIC at the read-out circuit corresponds to an image, e.g., the intensity of light on the different regions of the chip during an exposure period, e.g., a frame. The local optical intensity on the chip is related to a current flow and/or voltage bias read or measured by the read-out circuit.

Figure 3B:
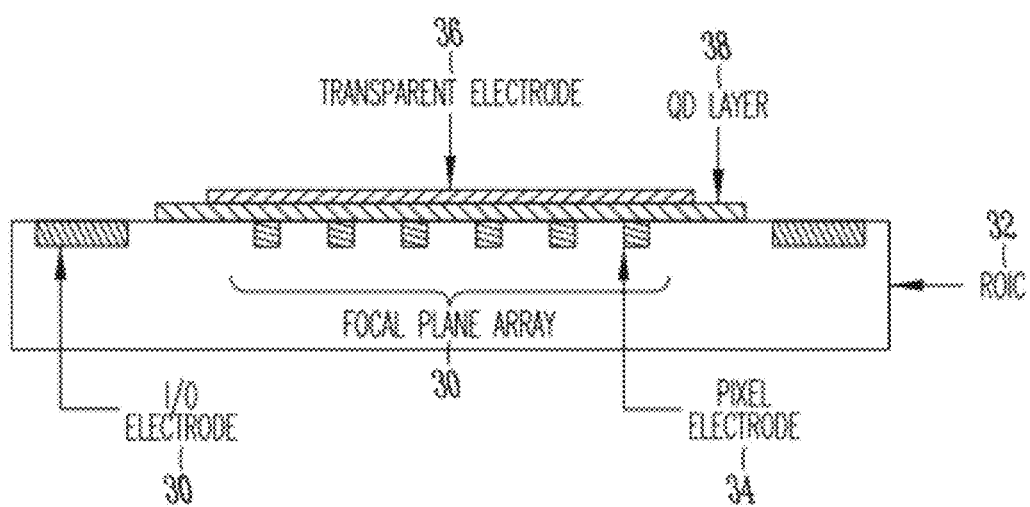
FIG. 3B shows side view of an optical device which includes an integrated circuit with an array of electrodes located on the top surface thereof.

FIG. 3B shows a schematic cross-section of the imaging system shown in FIG. 3A. The imaging system includes a read-out structure that includes a substrate 12, an optically sensitive layer 38, e.g., QD layer 38 and a transparent electrode 36. Substrate 32 includes a read-out integrated circuit (ROIC) having a top surface with an array of pixel electrodes 34 located in the top surface thereof with counter-electrodes 36 located outside the array, i.e., transparent electrode 36 overlaying QD layer 38. Electrodes 34 shown in FIG. 3B correspond to square electrode pads 300 shown in FIG. 3A. The array of electrodes 34, which together form focal plane array 30, provide voltages for biasing and current collection from a given pixel 34 of the array, and convey signals from the array to an input/output electrode 32 (connection not shown). Optically sensitive layer 38, e.g., QD layer, is formed on the top surface of the integrated circuit. More specifically, QD layer 38 overlays the array of pixel electrodes 34 on the top surface of the integrated circuit. The optically sensitive layer 38 defines an array of imaging pixels for collecting light incident thereon.

In the imaging system of FIG. 3B, QD layer 38 is monolithically integrated directly onto the electronic read-out chip. In contrast, as previously mentioned, existing imaging systems are often made by separately fabricating 1) the read-out integrated circuit and 2) the sensitizing semiconductor array, and subsequently assembling the two, e.g., using a process such as microbump bonding.

Figure 4A:
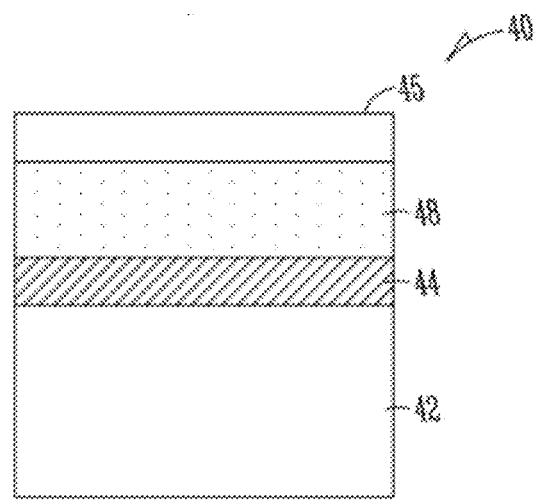
FIG. 4A is a side view of a portion of an optical device configured in a vertical sandwich structure.

Referring now to FIG. 4A, there is shown at 40 a side view of a basic optical device structure, which in certain embodiments can be used as an individual pixel in the completed integrated array shown in FIGS. 3A-3B. Device 40 includes substrate 42, which may be glass or other compatible substrate; contact/electrode 44; optically sensitive layer, e.g., QD layer 48; and at least partially transparent contact 45 that overlays the QD layer. Contacts 44 and 45 may include, e.g., aluminum, gold, platinum, silver, magnesium, copper, indium tin oxide (ITO), tin oxide, tungsten oxide, and combinations and layer structures thereof, and may include bandpass or band-block filters that selectively transmit or attenuate particular regions of the spectrum which are appropriate to the end use of the device. The device has an overall "vertical sandwich" architecture, where different components of the device generally overlay other components. In operation, the amount of current that flows and/or the voltage between contact 45 and contact 44 is related to a number of photons received by QD layer 48. In operation, current generally flows in the vertical direction. The embodiment shown in FIG. 4A may also include one or more additional optional layers for electron/hole injection and/or blocking. The layer(s) allows at least one carrier to be transported, or blocked, from an electrode into the QD layer. Examples of suitable layers include a QD layer including QDs of a different size and/or composition, semiconducting polymers, and semiconductors such as ITO and Si.

Figure 4B:
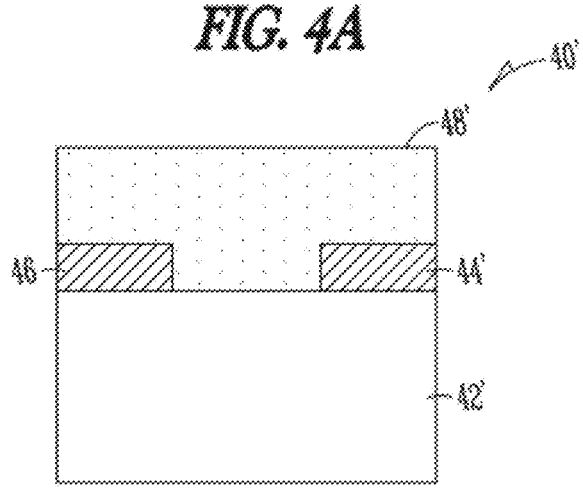
FIG. 4B is a side view of a portion of an optical device configured in a lateral planar structure.

Referring now to FIG. 4B, there is shown at 40' a side view of a basic device structure which has a different configuration than each pixel in the completed integrated array shown in FIGS. 3A-3B, but which could be used to form a similarly functioning optical device. The configuration in FIG. 4B corresponds to a lateral planar structure in which the optically sensitive layer 48' is deposited across two spaced contacts/electrodes 44' and 46. Contacts 44 and 46 are deposited on a substrate, e.g., glass substrate 42'. The integrated circuit, including contacts 44', 46, and substrate 42' may include any appropriate system with which the optically sensitive material is compatible (e.g., Si, glass, plastic, etc.). Contacts 44' and 46 may include aluminum, gold, platinum, silver, magnesium, copper, indium tin oxide (ITO), tin oxide, tungsten oxide, or combinations or layer structures thereof. The device has an overall "lateral planar" architecture, where at least some of the components of the device are generally laterally displaced from other components, forming a planar electrode structure. In operation, the amount of current that flows and/or the voltage between contact 44' and contact 46 is related to a number of photons received by the QD layer 48'. In operation, current generally flows in the lateral direction.

Figure 4C:
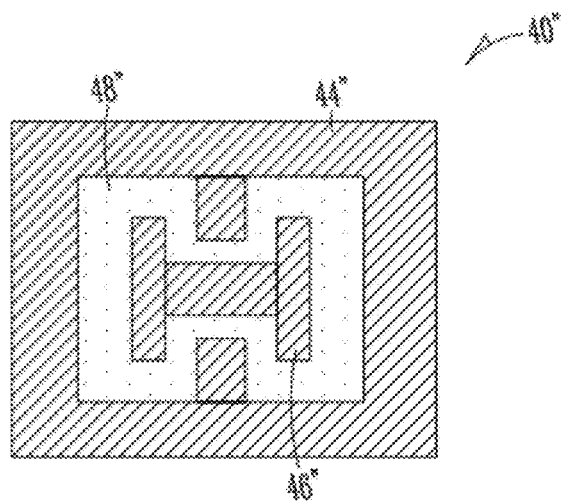
FIG. 4C is a plan view of a portion of an optical device configured in a lateral interdigitated structure.

FIG. 4C shows a plan view of another basic device structure 40" that includes interdigitated electrodes, and which also can be used to form an optical device. The materials may be selected from those provided above regarding FIGS. 4A-4B.

Each basic device 40, 40', and 40" as shown in FIGS. 4A-4C, among other possible architectures, can be thought of as representing a single device or an element in a larger device, such as in a linear array or a two-dimensional array. The basic devices can be used in many kinds of devices, such as detection and signal processing, as discussed above, as well as in emission and photovoltaic devices. Not all embodiments need be optical devices. Many QD layers have optical characteristics that can be useful for optical devices such as image sensors useful in one or more of the x-ray, ultraviolet, visible, and infrared parts of the spectrum; optical spectrometers including multispectral and hyperspectral; communications photodetecting optical receivers as well as free-space optical interconnection photoreceivers; and environmental sensors; Some QD layers also have electrical characteristics that may be useful for other kinds of devices, such as transistors used in signal processing, computing, power conversion, and communications.

In one embodiment, the underlying electrodes on the integrated circuit define imaging pixels in an imaging device. The QD layers formed on the electrodes supply optical-to-electrical conversion of incident light.

In another embodiment, in addition to the definition of pixels via electrodes on the integrated circuit, further patterning of the optically sensitive layers, e.g., QD layers, provides further definition of pixels, including of which pixel is read by which electrodes on the integrated circuit. This patterning may also be accomplished with well-known CMOS techniques such as photolithography. Other options include self-assembly of QD layers onto pre-patterned metal layers, such as Au, to which the QDs and/or their ligands have a known affinity. Patterning may also be achieved by depositing a conformal QD layer onto a topologically-variable surface, e.g., including "hills" (protrusions) and "valleys" (trenches) and subsequently planarizing the QD film to remove material accumulated on the "hills" while preserving that in the "valleys."

Further layers may be included in the layers atop the structure, such as electrical layers for making electrical contact (e.g. an at least partially transparent contact such as indium tin oxide, tin oxide, tungsten oxide, aluminum, gold, platinum, silver, magnesium, copper, or combinations or layer structures thereof), antireflection coatings (e.g. a series of dielectric layers), or the formation of a microcavity (e.g. two mirrors, at least one formed using nonabsorbing dielectric layers.), encapsulation (e.g. an epoxy or other material to protect various materials from environmental oxygen or humidity), or optical filtering (e.g. to allow visible light to pass and infrared light not to, or vice-versa.)

The integrated circuit may include one or more semiconducting materials, such as, but not limited to silicon, silicon-on-insulator, silicon-germanium layers grown on a substrate, indium phosphide, indium gallium arsenide, gallium arsenide, or semiconducting polymers such as MEH-PPV, P3OT, and P3HT. The integrated circuit may also include one or more semiconducting organic molecules, non-limiting examples being end-substituted thiophene oligomers (e.g. alpha,w-dihexyl hexathiophene (DH6T)) and pentacene. Polymers and organic molecules can be useful as a substrate in the QD devices because they may be flexible, and thus allow "bendable" and "conformable" devices to be made that are thus non-planar.

Other appropriate substrates may include, e.g., plastic and glass.

Optically Sensitive Layer

The optically sensitive layer includes a material that is optically sensitive in any one or more of the infrared, visible and ultraviolet region of the electromagnetic spectrum. As discussed above, in many embodiments the optically sensitive layer includes one or more types of quantum dot nanocrystals (QDs), which may be fused together.

In some embodiments, the optically sensitive layer includes a combination of two or more types of QDs, each including a distinct semiconductor material and/or having distinct properties. The different types of QDs may be separately synthesized and mixed prior to being applied to the surface of the integrated circuit or they may be synthesized in a 'one pot' synthesis—i.e. in a single vessel.

In some embodiments, the optically sensitive layer includes an optically sensitive semiconducting polymer such as, but not limited to MEH-PPV, P3OT and P3HT. In other embodiments the optically sensitive layer includes a polymer-QD mixture having one or more types of QDs that sensitive to different parts of the electromagnetic spectrum.

A. Quantum Dot Nanocrystals

In many embodiments, the QDs are fabricated using known techniques, but in substantially inert, anhydrous environments, e.g., environments that are substantially free of water and oxygen. Syntheses may be performed using Schlenk line methods in which ambient gases such as oxygen and water in the air are excluded from the system, and the syntheses are instead performed in the presence of substantially inert gases such as nitrogen and/or argon, or in a vacuum.

In some embodiments, the QDs include any one or combination of PbS, InAs, InP, PbSe, CdS, CdSe, ternary semiconductors, and a core-shell type semiconductors in which the shell is one type of semiconductor and the core is another type of semiconductor. For example, the ternary QDs may be $In_xGa_{1-x}As$ nanocrystals or $(Cd—Hg)Te$ nanocrystals. For example, the core-shell quantum dot nanocrystals may be ZnSe(PbS), ZnS(CdSe), ZnSe(CdS), PbO(PbS), or $PbSO_4$ (PbS).

In some embodiments, before depositing the QD precursor layer on the integrated circuit or substrate, the QDs are ligand exchanged to substitute the as-fabricated ligands with pre-selected ligands, e.g., ligands that are considerably shorter than the as-fabricated ligands. The pre-selected ligands are selected to be sufficiently short to enable closer packing of the QDs in the precursor layer. Closer packing allows the QDs to fuse together in a subsequent step, thereby greatly increasing the electrical conductivity between the QDs. The preselected ligands may also be selected to be relatively volatile, so that they can be vaporized during a subsequent step to provide a film consisting mainly of QDs and being substantially free of ligands. This allows the QDs to get much closer to each other, which may enhance the conductivity in the final device. For example, the QDs may be fabricated with a first set of ligands with carbon chains that are more than 10 carbons long; the first set of ligands is then substituted with a second set of ligands with carbon chains that are between 1-10 carbons long. In some circumstances, the ligands of the second set of ligands is less than about 1 nm long. This can bring the QDs closer, e.g., more than 50% closer, more than 75% closer, or even more than 90% closer, than they could get before ligand exchange. The second set of ligands may generally have an affinity for attachment to the QDs that is at least competitive with the affinity of the first set of ligands to attach to the QDs, otherwise the first set of ligands may not sufficiently exchange with the first set of ligands. The second set of ligands may also generally have an affinity for attachment to the QDs which allows them to be removed during a later step. This affinity is related to the end functional group on the ligand, which is illustrated in FIG. 1. Amines, thiols, carboxylates, and sulfones, among other end functional groups, many of which will have free electron pairs, are generally suitable for use in the second (pre-selected) set of ligands.

In some embodiments, the ligand exchange involves precipitating the as-synthesized QDs from their original solution, washing, and redispersing in a liquid that will dissolve and thus dissociate the original ligands from the outer surfaces of the QDs, and which either is or contains the ligands to be substituted onto the QDs. In some embodiments the liquid is or includes primary, secondary, or tertiary-butylamine, pyridine, allylamine, methylamine, ethylamine, propylamine, octylamine, or pyrrolidine or a combination of these organic solvents, which substitute the ligands previously on the QDs. In other embodiments, the liquid is or includes pyridine, which substitutes the ligands previously on the QDs. Leaving the QDs in this liquid for between 24 and 120 hours either at room temperature or at an elevated temperature is generally sufficient for ligand exchange, although in some circumstances longer or shorter times will be sufficient. In an illustrative example, the ligand exchange process was performed under an inert atmosphere to prevent the QDs from oxidation. QDs having oleate ligands and dissolved in methanol were precipitated, dried, and redispersed in n-butylamine at a concentration of 100 mg/ml (nanocrystals by weight/butylamine by volume). The solution was left for 3 days under inert conditions. The oleate ligands had a length of about 2.5 nm, and the exchanged butylamine ligands had a length of about 0.6 nm, bringing the QDs to about 25% of their original distance from each other.

In some embodiments, two or more types of QDs are separately fabricated in coordinating solvents. Each kind of QD is then precipitated, washed, and dispersed in a liquid that is or contains the ligands to be substituted onto the QDs. This exchanges the ligands on the two or more types of QDs as discussed above. Then the two types of QDs are mixed in solution to create a heterogeneous QD mixture, which is spin-cast or otherwise deposited as thin films on a substrate to form a heterogeneous QD precursor layer. The order in the heterogeneous QD precursor layer is controlled through separate selection of QD size and ligand for each type of QD and additional treatment with solvents and heating.

Examples of ligands include amine-terminated ligands, carboxyl-terminated ligands, phosphine-terminated ligands and polymeric ligands. The amine-terminated ligands may include any one or combination of pyridine, allylamine, methylamine, ethylamine, propylamine, butylamine, octylamine, and pyrrolidine. The carboxyl-terminated ligands may include any one or combination of oleic acid, stearic, capric and caproic acid. The phosphine-terminated ligands may include guanosine triphosphate. The ligand may be one or more of DNA, an oligonucleotide, a polymer such as polythiophene or MEH-PPV, or an oligomer such as oligothiophene. As mentioned above, it can be useful to substitute short and volatile ligands, e.g., pyridine, allylamine, methylamine, ethylamine, propylamine, butylamine, octylamine, or pyrrolidine, onto the QDs so that the QDs can be brought into closer proximity in later steps.

B. Forming Precursor OD Layer on Integrated Circuit

After the QDs are fabricated and ligand-exchanged, e.g., as described above, they may be deposited onto a substrate such as an integrated circuit. This forms a "QD precursor layer," which may be subsequently processed to form a finished QD layer for use in a device.

The QD precursor layer may be formed by solution-depositing it directly on the surface of a read-out integrated circuit or other substrate, for example using spray-coating, dip-casting, drop-casting, evaporating, or blade-casting. Another method of depositing the QD precursor layer is spin coating the QD precursor layer, which once spin-coated onto the surface may be further processed to form the optically sensitive QD layer as described below. In many embodiments, the QD layer has a thickness selected to absorb most or even substantially all of the light incident on it, in the wavelength region the device is intended to operate in. Typically this thickness will range between about 50 nm and 2 µm, though thinner or thicker films can be used according to the desired functionality of the device. Spin-coating can allow the process of covering circuitry with a QD layer to be performed at lower temperatures without vacuum processing and alignment and bonding issues.

C. Ligand Removal and Annealing of OD Precursor Layer

After forming the QD precursor layer, the QDs may be fused together to produce a QD film with enhanced optical and electrical characteristics, and which is suitable for use in a finished electronic or optoelectronic device.

In one embodiment, at least a portion of the QDs in the QD precursor layer are fused by annealing the layer at temperatures up to about 450° C., or between about 150° C. and 450° C. In other embodiments, the layer is treated at lower temperatures, for example between about room temperature up to about 150° C., or up to about 100° C., or up to about 80° C. In some embodiments, the QD precursor layer is not heated substantially above ambient (room) temperature. As mentioned above, the step of fusing brings the cores of adjacent QDs into direct physical and electrical contact. It is also possible to "overfuse" the QDs, in which case they may lose their individual characteristics and appear more like a bulk semiconductor material. It is desirable to prevent such overfusing through the parameters chosen for annealing or through monitoring to prevent an overfused condition. The annealing step will typically be performed in a vacuum or in an otherwise anhydrous environment to prevent the development of defect states (e.g., oxidation) on the outer surfaces of the QDs before the cores of the QDs fuse together. This way, there will be substantially no defect states in the regions where the QDs are joined together, but these regions instead will have a substantially homogeneous composition and crystalline structure. In other embodiments the fusing step may be performed in an oxygen-rich environment, or an oxygen environment in which the partial pressure of oxygen is regulated.

The ligands in the QD precursor layer are also typically removed, either before or concurrently with the fusing step. For example, if the ligands in the QD precursor layer are volatile, they may easily be removed during annealing because they will simply volatilize from the heat. Or, for example, if the ligands in the QD precursor layer are not volatile, they can be removed from the QD precursor layer by soaking the layer in a solvent that dissolves and thus dissociates the ligands from the QDs but which does not generally disrupt the arrangement of QDs in the QD layer. In general, it is preferable that removing the ligands does not significantly change the volume of the QD layer, e.g., by less than about 30%; a large volume change may crack or otherwise damage the finished QD film.

D. Creation of Defect States on Outer Surfaces of Fused ODs

In many embodiments, particularly those suitable for optical applications, defect states are created on the outer surfaces of the fused QDs. By "defect state" it is meant a disruption in the otherwise substantially homogeneous crystal structure of the QD, for example, the presence of a dislocation or a foreign atom in the crystal lattice. In many cases this defect state will exist on the outer surface of the QDs. A defect state can be created by, e.g., oxidizing the QDs after fusing and ligand removal. During operation, if an electron-hole pair is generated within the QD film, one or more holes may be trapped by the defect state; this will preclude rapid recombination of holes with electrons, which will then allow the electrons to flow for a much longer time through the film. This can positively affect photoconductive gain, among other things.

In general, the outer surface of the fused QDs can be coated or otherwise treated so it has a different composition than the cores of the fused QDs. For example, the outer surface can include a semiconductor or insulator shell.

E. Summary of Steps in Fabricating OD Layer

Figure 5:
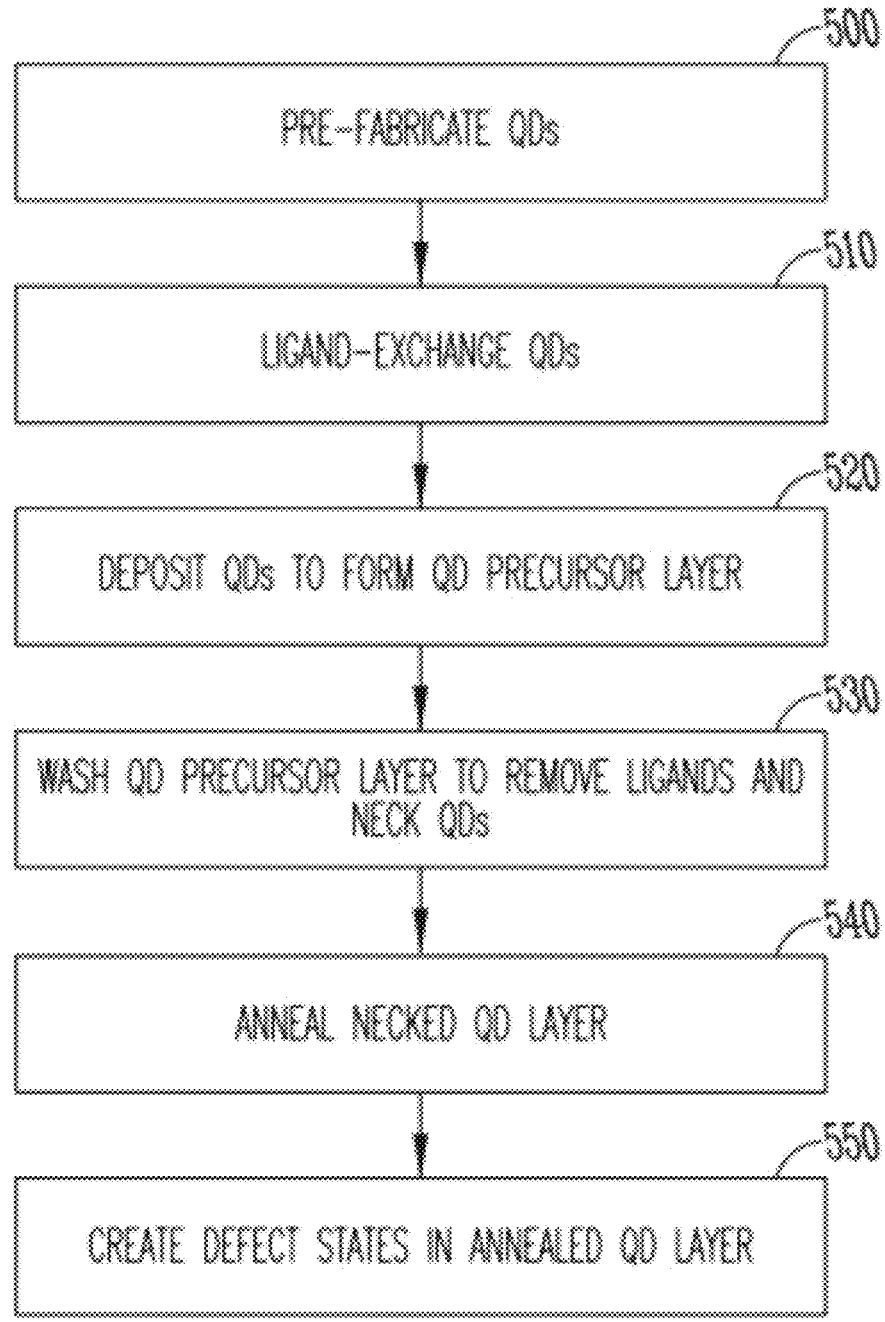
FIG. 5 shows an overview of steps in a method of making a QD optical device with enhanced gain and sensitivity.

FIG. 5 shows a flow chart of steps in a method for creating various embodiments of QD layers for use in optical devices.

First, the QDs are fabricated (500), e.g., using well-known techniques. The QDs will typically include a plurality of relatively long ligands attached to their outer surfaces.

Then, the QDs are ligand-exchanged (510), e.g., by substituting shorter ligands for those used during fabrication of the QDs. This step may allow the QDs to pack more closely in subsequent processing steps.

Then, the QDs are deposited on a suitable substrate (520), e.g., on an electronic read-out integrated circuit. This step may be accomplished with various solution-based methods, many of which are compatible with standard CMOS processes such as spin-coating.

Then, the precursor layer is washed to remove the ligands on the QDs, and to cause necking (i.e. touching) between at least some adjacent QDs (540).

Then, the necked QD layer is annealed, which fuses necked QDs together (540).

Then, defect states are created in the fused QD layer (550), e.g., by oxidizing the layer.

In general, when fabricating a device intended to have multiple pixels, the QD layer may then optionally be patterned, e.g., using photolithography, to separate the continuous layer into a plurality of pixels.

The resulting QD layer can be incorporated into devices such as those described herein.

EXAMPLES

Figure 7A:
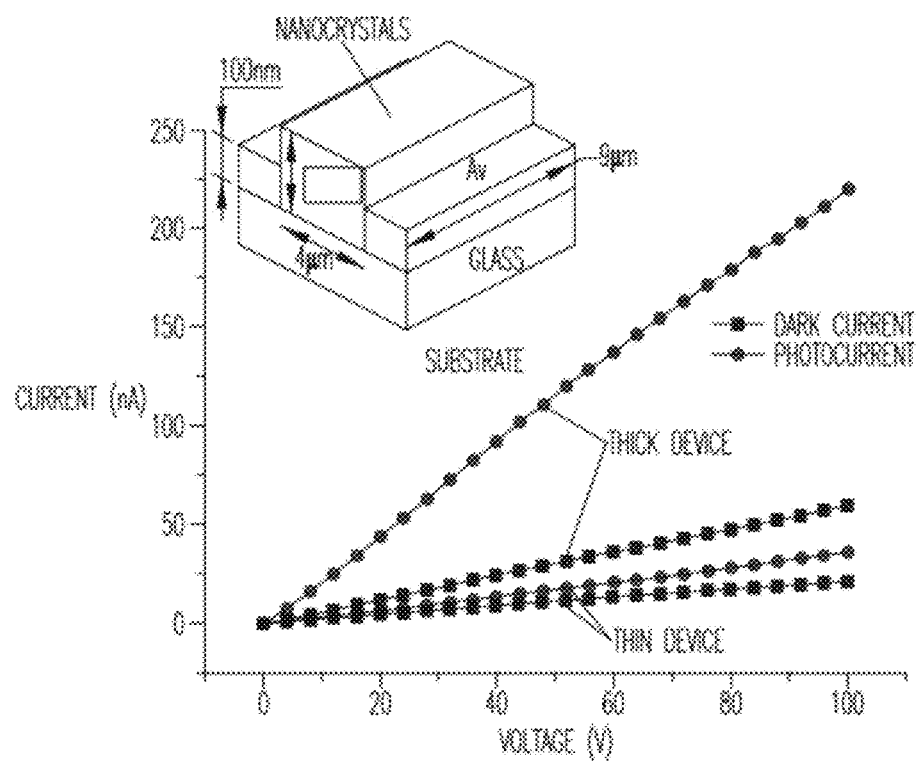
FIG. 7A shows a device structure (inset) and plots of I-V characteristic for 100 nm and 500 nm QD layer devices.

An exemplary photoconductive detector was made using a single layer of PbS QD nanocrystals spin-cast directly from a chloroform solution onto an interdigitated electrode array. The device structure is illustrated in FIG. 7A, and is analogous to the basic device of FIG. 4B. The parallel gold electrodes are supported by a glass substrate and have a height, width, and separation of 100 nm, 3 mm, 5 µm, respectively. The thickness of the QD layer was controlled through the concentration of the chloroform-QD solution and the spin-casting parameters. In studies carried out by the inventors the thickness ranged from 100 nm up to 500 nm.

The treatment of the surfaces of the QDs was an important determinant of photodetector performance. Devices made directly from QDs capped with oleic acid, as synthesized through an organometallic route, did not exhibit any measurable conductance, as the 2 nm-long oleate ligand inhibits carrier transport among QDs. A post-synthesis ligand exchange was therefore used to replace the as-synthesized oleate ligands with much shorter butylamine ligands. To this end, the QDs were redispersed in butylamine for a period of three days. Butylamine is a four-carbon-atom chain with an amine head as the functional group to attach to the QD surface. The ligand exchange was monitored for blue shift in QD absorption resulting from a decrease in QD effective diameter as ligands remove Pb atoms during exchange.

Figure 6A:
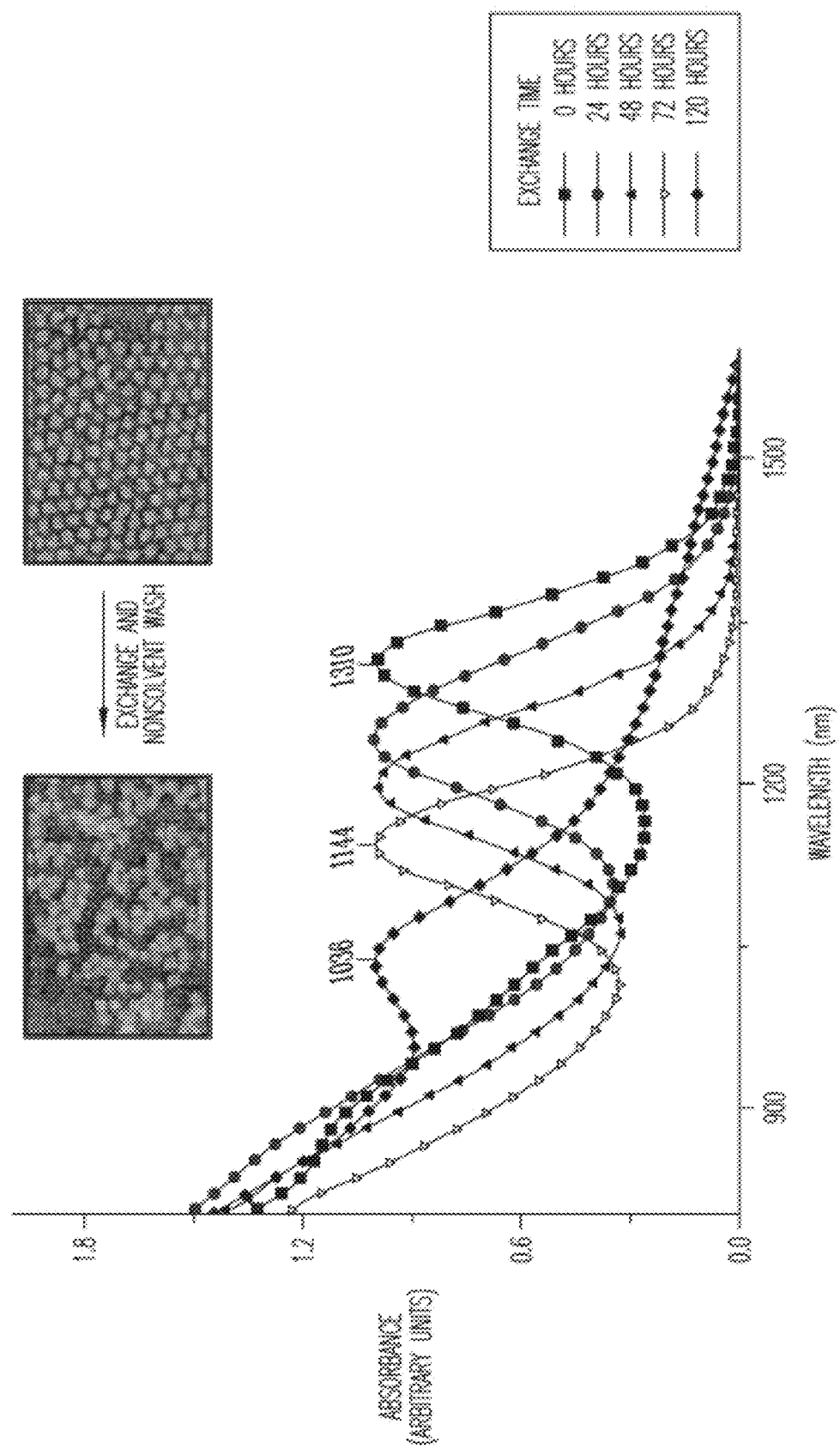
FIG. 6A shows absorption spectra and TEM images of lead sulfide QDs as ligands are exchanged from oleic acid to primary butylamine.

FIG. 6A shows absorption spectra and TEM images of lead sulphide QD nanocrystals as the ligands are exchanged from oleic acid to primary butylamine. The TEM images illustrate the dramatic decrease of inter-QD spacing following ligand exchange and nonsolvent treatment. The absorption spectrum shifts steadily to the blue with increasing exchange time. When the shift is less than that associated with the removal of a monolayer of Pb atoms (roughly 170 nm), the size distribution remains roughly constant. After this point the polydispersity increases. In the example provided, the best device performance was obtained using QD nanocrystals shifted by ~170 nm.

The QDs were precipitated, washed using a nonsolvent, redispersed in $CHCl_3$, and treated again using a nonsolvent ("nonsolvent" refers to a material that is not a solvent for the nanocrystals, but that may be a solvent for the ligands). The impact of ligand exchange and nonsolvent treatment on QDs is illustrated in the transmission electron micrographs of FIG. 6A. The as-grown (untreated) QD nanocrystals show well-ordered patterns with interdot spacing determined by ligand length. Exchanged and washed QDs exhibit a drastic reduction in interdot spacing and preferential formation of clusters instead of well-ordered arrays. Prior to treatment, the nanocrystal films can be redispersed using organic solvents, while after treatment, nanocrystal films can no longer be readily redispersed.

The combination of ligand exchange, nonsolvent treatment, and thermal processing at temperatures such as up to about 150° C. (typically) and potentially as high as 450° C., removes at least a portion of the QDs' ligands, and enables the QDs to fuse, providing mechanically robust films with vastly increased electrical conductivity, as reported below.

Figure 6B:
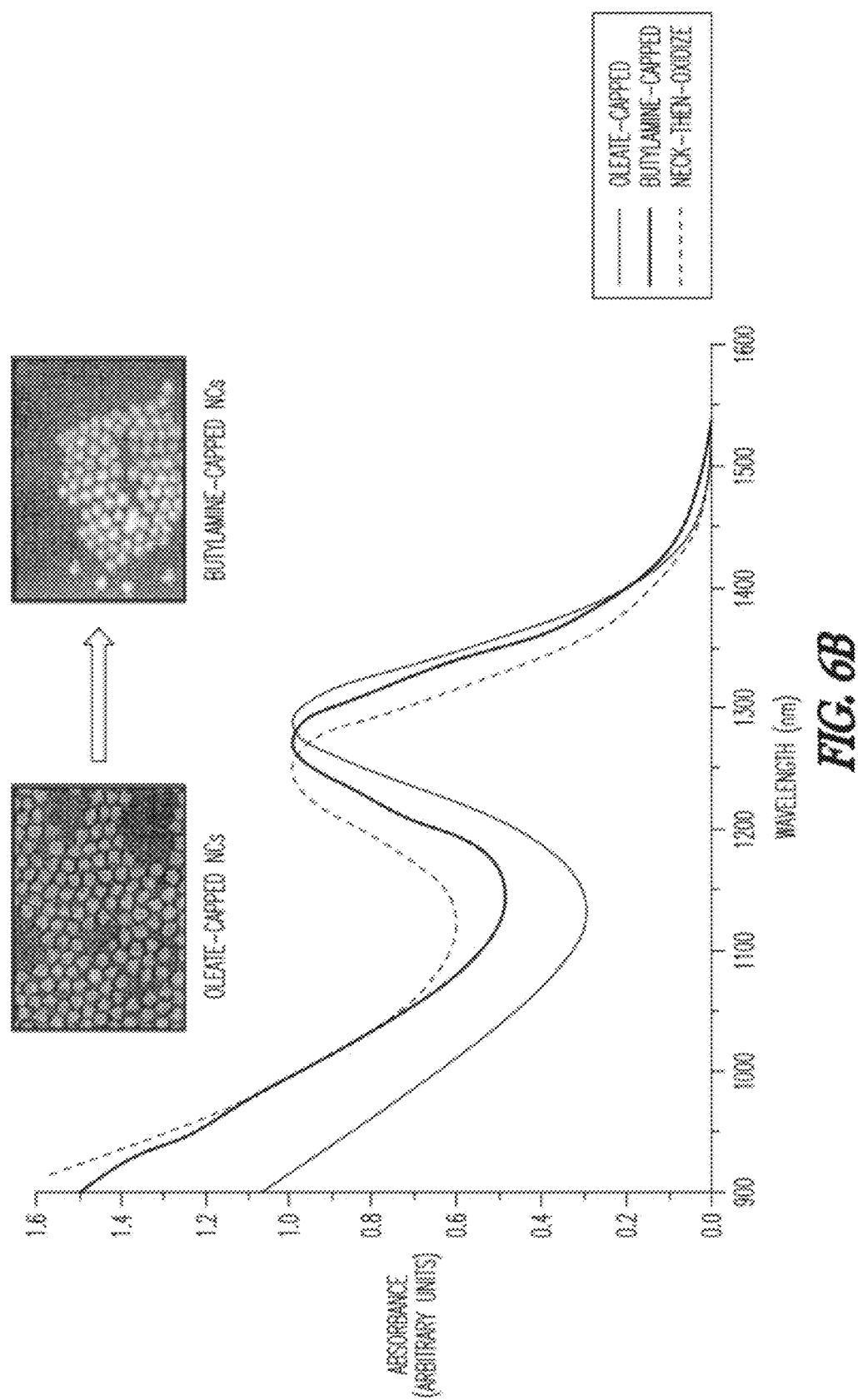
FIG. 6B shows absorption spectra and TEM images of lead sulfide QDs as ligands are exchanged from oleic acid to primary butylamine.

FIG. 6B shows the absorbance spectra of QD nanocrystals before ligand exchange (oleate-capped), after ligand exchange (butylamine-capped), and following soaking in methanol for 2 hours to remove the butylamine ligands. The progressive blueshift across these treatments is consistent with surface modification following exchange and partial surface oxidation (also confirmed by XPS and FTIR). The inset of FIG. 6B shows TEM micrographs of the nanocrystals before and after ligand exchange. The reduction in interparticle distance is attributed to the replacement of the oleic acid ligands with butylamine ligands.

Figure 6C:
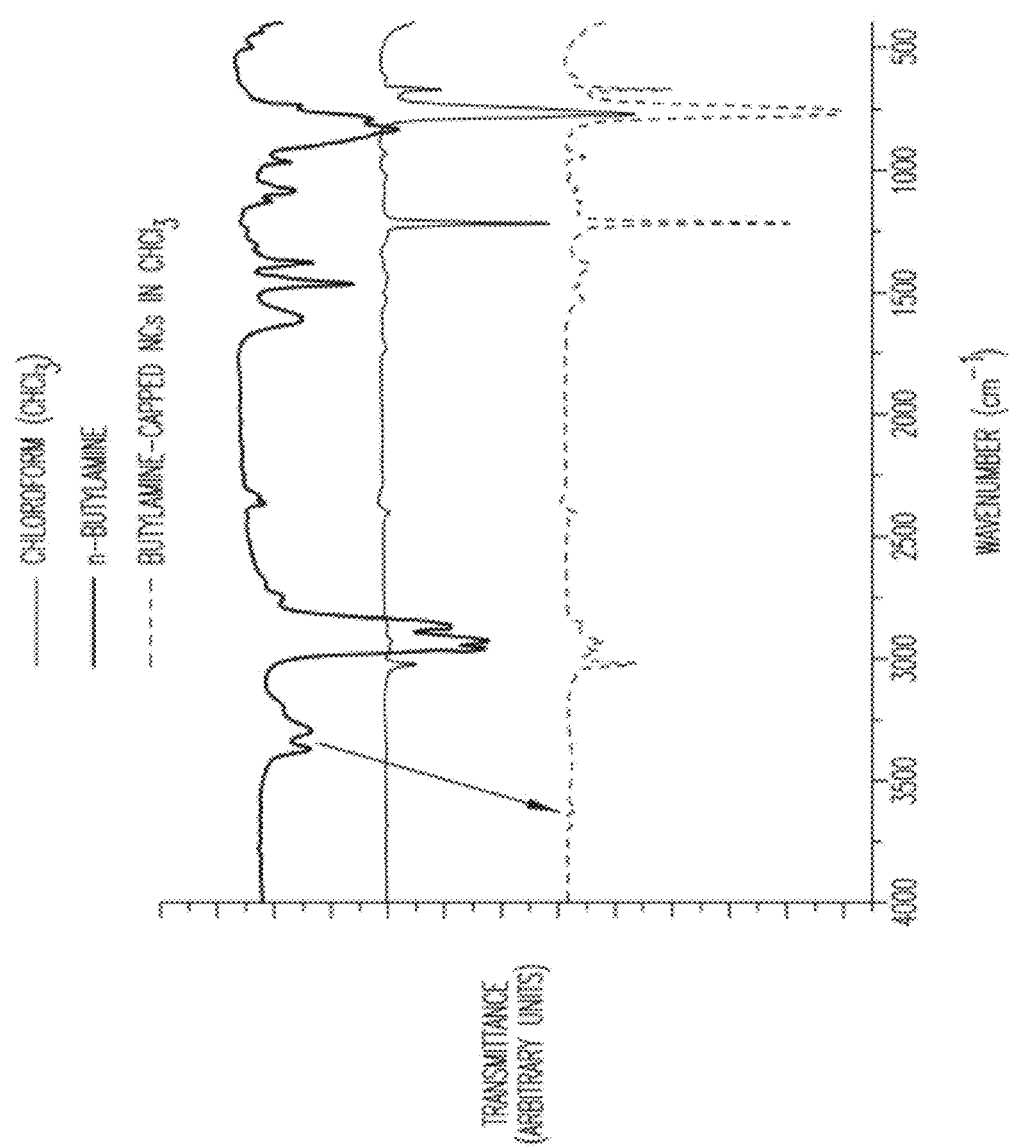
FIG. 6C shows FTIR spectra of lead sulfide QDs after ligands are exchanged to primary butylamine.

FIG. 6C shows the FTIR spectra of the neat solvent n-butylamine, the neat solvent chloroform, and n-butylamine-exchanged QDs dispersed in chloroform. N—H stretching and bending vibrations are tabulated to lie between 3200-3600 $cm^{-1}$ and 1450-1650 $cm^{-1}$ respectively. Carbonyl stretching vibration of pure oleic acid is tabulated to be found at 1712 $cm^{-1}$. The results indicated that oleate ligands originally attached to the PbS QDs have been replaced by n-butylamine, indicated by the absence of carbonyl stretching vibration, a significant shift of the N—H stretching vibrations after exchange from 3294 and 3367 $cm^{-1}$ (A=73 $cm^{-1}$) for n-butylamine to 3610 and 3683 $cm^{-1}$ (A=73 $cm^{-1}$), and the presence of N—H bending vibrations for the n-butylamine exchanged sample.

FIG. 6D shows the FTIR spectra of inert-exchanged ligand-exchanged QDs with butylamine ligands before and after methanol wash, which substantially removes the ligands from the QDs. Following methanol wash, features attributable to butylamine (1400, 1126, 989, 837, and 530 $cm^{-1}$) are much less pronounced. The inset also shows the N—H stretching vibrations, which are again much less pronounced following methanol wash.

Figure 6E:
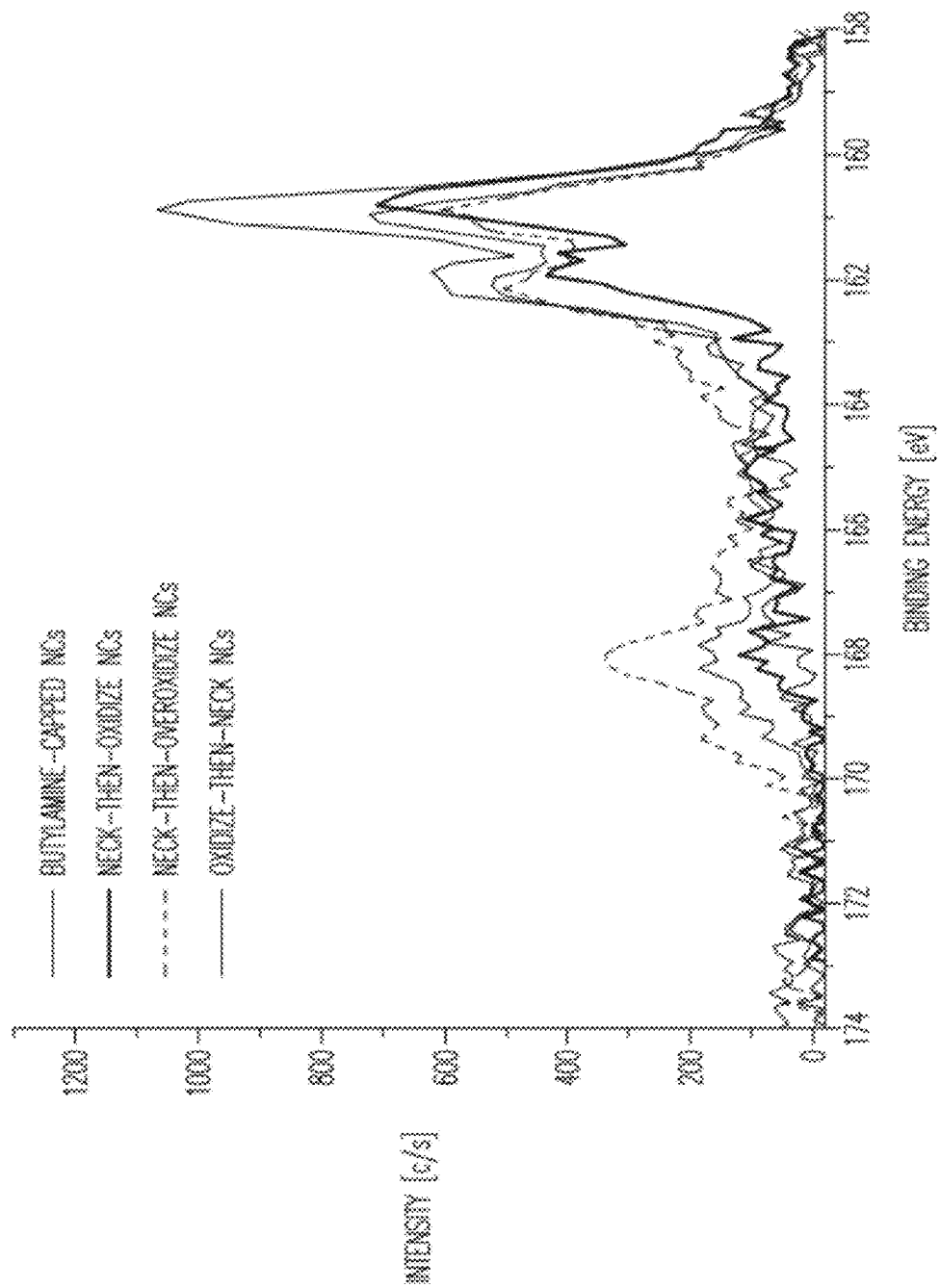
FIG. 6E shows XPS data of lead sulfide QDs through various processing stages.

FIG. 6E shows spectra obtained by X-ray photoelectron spectroscopy (XPS) to confirm the material modifications that occur to the PbS QDs throughout various processing steps. After background subtraction, the binding energy was reference to the C1s hydrocarbon line at 285.0 eV. The curves were fitted by applying Gaussian-Lorentzian functions and the atomic ratios were obtained by integrating the areas under the signals. The nanocrystals immediately after exchange to butylamine ligands demonstrate a S2- peak at 160.7 eV corresponding to lead sulfide. No lead sulfate ($PbSO_4$) signal was detected. Nanocrystals that were precipitated in air exhibit an $SO_4^{-2}$ at 167.5 eV characteristic of $PbSO_4$ formation. This oxide may be associated with the role of barrier to conduction among nanocrystals. The ratio of $PbS/PbSO_4$ for this case was found to be about 3.4:1. XPS of the inert-precipitated QDs after methanol soaking exhibits also formation of lead sulfate. The $PbS/PbSO_4$ ratio in this case was 18.6:1. Further annealing of this film in air at 120° C. for 1 hour dramatically increased the amount of sulfate and the $PbS/PbSO_4$ ratio was 2.44:1.

Figure 6F:
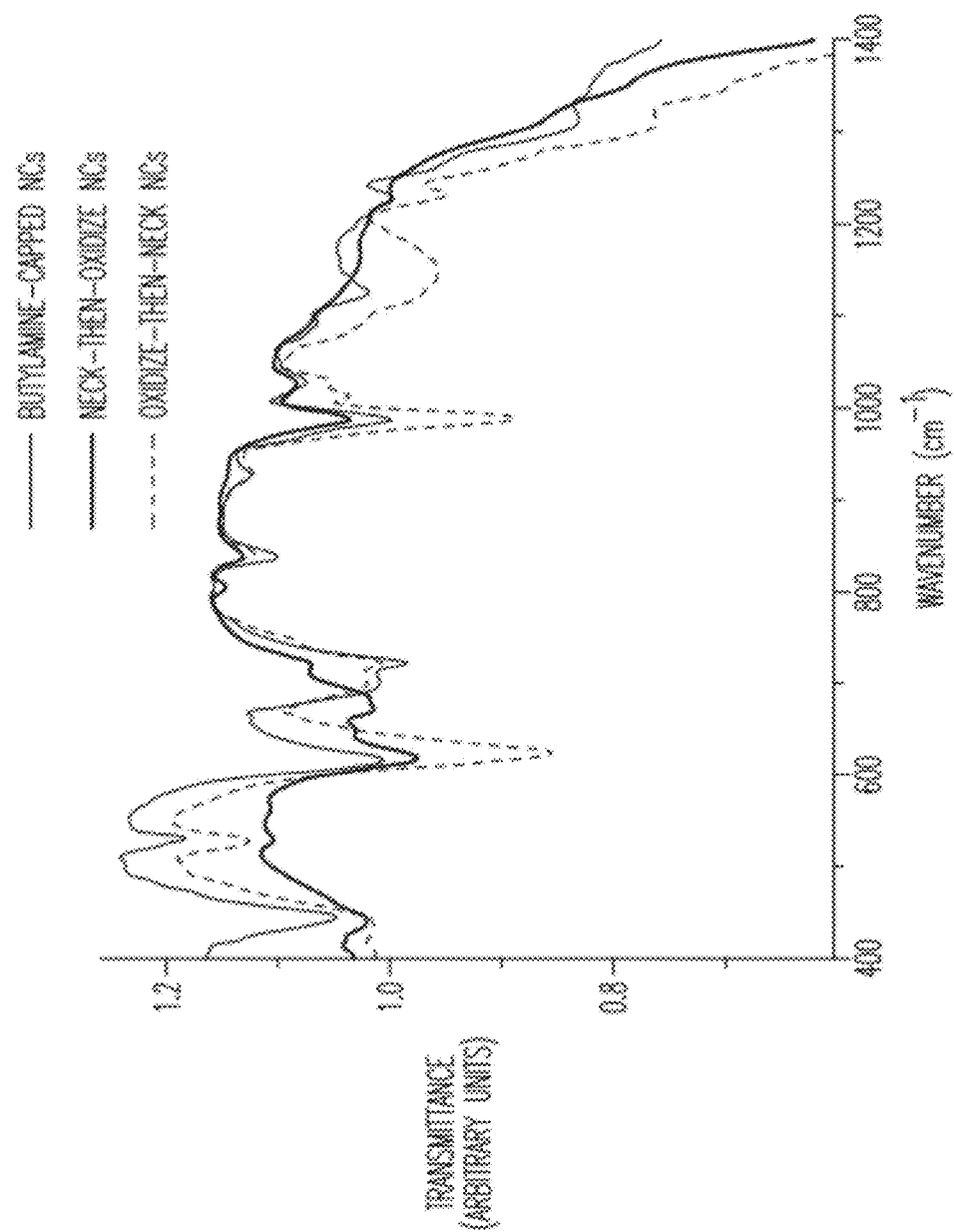
FIG. 6F shows FTIR data of lead sulfide QDs precipitated in inert and in oxidizing conditions.

FIG. 6F shows the FTIR spectra of ligand-exchanged QDs precipitated in inert conditions (butylamine-called QDs) and precipitated in air-ambient conditions (oxidize-then-neck QDs). The inert-precipitated exchanged QD layer after 2 hours of methanol wash (neck-then-oxidize QDs) are also shown. The broad feature around 1147 $cm^{-1}$ is attributed to $PbSO_4$ (lead sulfate). The spectra show that ligand-exchanged QDs precipitated in inert conditions do not show this feature; methanol wash introduces some oxidation; ligand-exchanged QDs precipitated under an air ambient show evidence of strong oxidation. These results agree with the XPS data above.

Some performance characteristics of various representative devices having different kinds of QD nanocrystal layers (e.g., neck-then-oxidize, oxidize-then-neck, butylamine-capped, and neck-then-overoxidize) were measured. The general device structure also shown in the inset of FIG. 7A, and can be seen to generally be similar to that of FIG. 4B. The device included a transparent glass substrate; two gold electrodes having a length of about 3 µm, a width of about 5 µm, and being spaced from each other by about 5 µm; and a QD nanocrystal of variable thickness between the electrodes.

Photoconduction was studied with the aid of optical excitation through the glass substrate, with excitation light being transmitted through the space separating interdigitated electrodes, i.e., where the QD layer was formed. The current-voltage characteristics for two different QD nanocrystal layer thickness are depicted in FIG. 7A, specifically the I-V characteristic for a "thin" 100 nm and a "thick" 500 nm QD nanocrystal layer devices. Photocurrents and dark currents respond linearly to applied bias. The responsivity of the thick device reached 166 A/W. The linear I-V characteristic indicates an ohmic electrode-nanocrystal contact and suggests not a tunneling but a strong, direct conductive connection between QD nanocrystals. Photocurrent in the thick device is significantly higher than the photocurrent of the thin device by virtue of greater absorbance in the thick device.

In order to determine optical power incident over the detector area and to calculate the responsivity R, a 2 mm radius beam from a 975 nm laser was incident, first through a series of optical attenuators of known transmittance, and thence through the glass substrate, onto the device from the back side. On the top surface, infrared-opaque interdigitated gold electrodes were separated by 5 µm over a 3 mm path length. The optical power incident on the device was obtained by integrating the intensity profile of the laser over the unobstructed area of the device. Current-voltage characteristics were acquired using an Agilent 4155 semiconductor parameter analyzer. The optical power impinging on each device was about 80 pW.

Figure 7B:
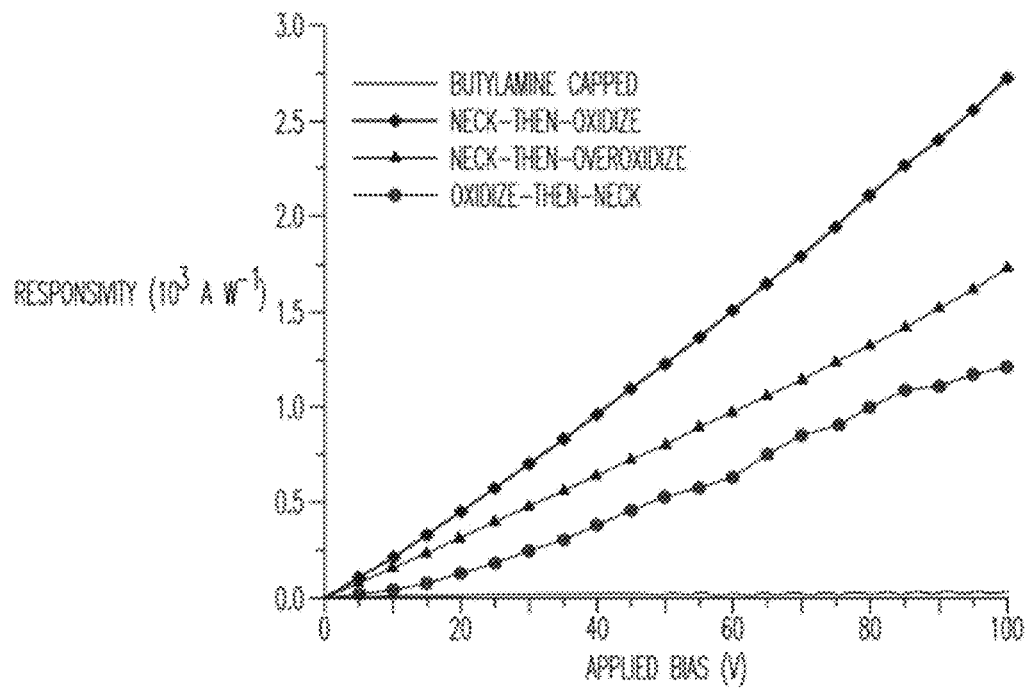
FIG. 7B shows the responsivity of a variety of QD layer devices.

The responsivity as a function of applied bias of devices made with different kinds of QD nanocrystal layers is shown in FIG. 7B. Here, the nanocrystal layers were about 800 nm thick. The "neck-then-oxidize" QD device, corresponding to a device having a layer of fused QDs with defect states on their outer surfaces, can clearly be seen to have a significantly higher responsivity than the other devices. The "oxidize-then-neck" QD device, in which the ligands are removed from the QDs, and the QDs are fused, but in which the QDs are not maintained in an inert atmosphere between the steps of ligand removal and QD fusing, has defect states in the regions in which the QDs are joined that reduces their responsivity, as compared with the "neck-then-oxidize" device, in which the QDs are maintained in an inert atmosphere between the steps of ligand removal and QD fusing. All of the "necked" devices have a significantly higher responsivity than the device having butylamine capped QDs, in which the butylamine ligands block facile conduction of electrons between QDs.

In general, the responsivity of QD devices (particularly the "neck then oxidize" QD devices) as measured in A/W is at least about 10 A/W, 100 A/W, 1000 A/W, or even more than about 10000 A/W. The responsivity is a function in part of the bias voltage applied, with a greater responsivity at higher bias. In some embodiments, the QD devices (particularly the "neck then oxidize" QD devices provide a substantially linear responsivity over 0-10 V with a bias applied across a distance of 0.2 to 2 µm width or gap.

Figure 7C:
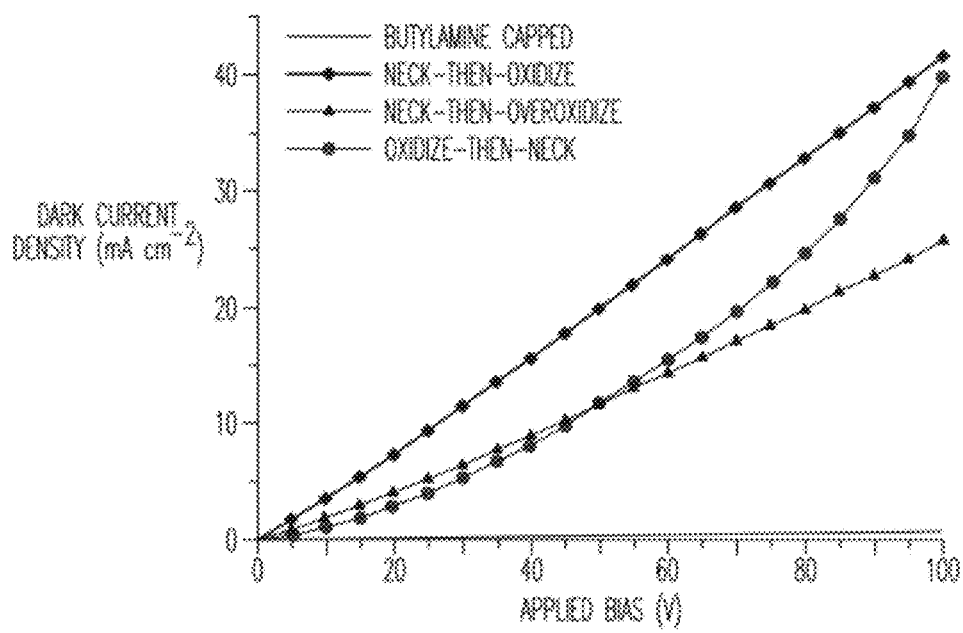
FIG. 7C shows the dark current density of a variety of QD layer devices.

FIG. 7C shows the dark current density for the devices described regarding FIG. 7B. As for the responsivity, "necked" devices have a significantly higher dark current density than the device having butylamine capped QDs. Devices made using QDs exposed to oxygen before necking ("oxidize-then-neck") show a superlinear I-V behavior characteristic of field-assisted transport. In contrast, devices made using QDs fused before oxidation ("neck-then-oxidize") exhibit linear (field-independent) behavior. Further oxidation of neck-then-oxidize devices ("neck-then-overoxidize") leads to a decrease of conductivity owing to excessive oxide formation.

Figure 7D:
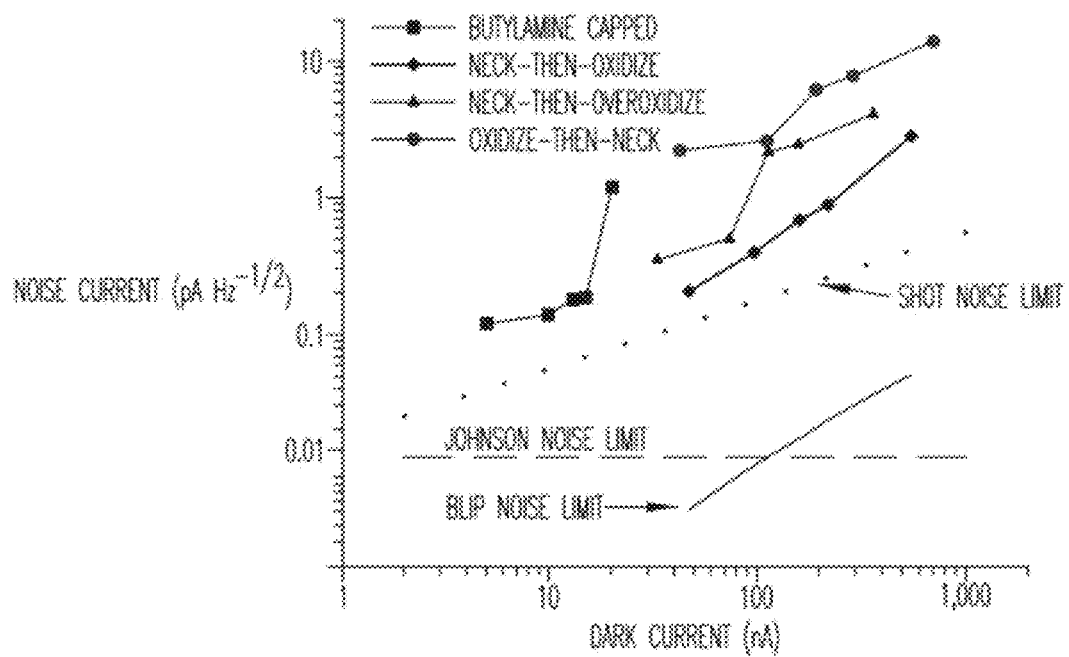
FIG. 7D shows the measured noise current as a function of measured dark current for a variety of QD layer devices.

FIG. 7D shows the measured noise current as a function of the measured dark current for the devices described regarding FIG. 7B. "Neck-then-oxidize" devices exhibited the lowest noise current, approaching within 3 dB the shot noise limit. "Oxidize-then-neck" devices had the highest noise current, consistent with multiplicative noise. "Neck-then-overoxidize" QD devices showed lower noise levels than the oxidize-then-neck QD devices although they contained larger amounts of oxide. This indicates the role of the oxidation step in the fabrication process. The Johnson noise limit, the shot-noise limit, and the fundamental background-limited thermodynamic (BLIP) noise current of the best-performing device (neck-then-oxidize) are also plotted for comparison.

Figure 7E:
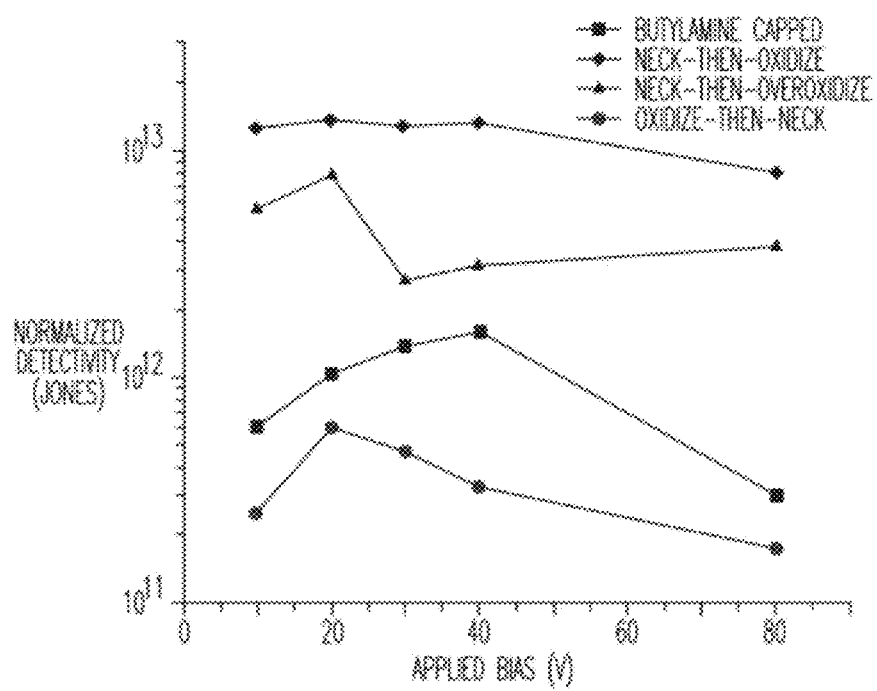
FIG. 7E shows the normalized detectivity of a variety of QD layer devices.

FIG. 7E shows a plot of the normalized detectivity D* as a function of applied bias. The normalized detectivity D* is measured in units of Jones ($cmHz^{1/2} W^{-1}$). D* is given as $(A\Delta\eta_\perp)^{1/2} R/I_n$, where A is the effective area of the detector in $cm^2$, $\Delta\eta_\perp$ is the electrical bandwidth in Hz, and R is the responsivity in $AW^{-1}$ measured under the same conditions as the noise current $i_n$ in A. The material figure of merit D* allows comparison among devices of different powers and geometries. The device figure of merit, noise equivalent power (NEP)—the minimum impinging optical power that a detector can distinguish from noise—is related to D* by NEP=$(A\Delta\eta_\perp)^{1/2}/D^*$. As can be seen in FIG. 7E, the normalized detectivity D* is the highest for the "neck-then-oxidize" device, and the lowest for the "oxidize-then-neck" device. In other words, allowing the QDs to be exposed to oxygen after ligand removal and before necking or fusing significantly affects the normalized detectivity of the finished device. In the example devices shown, the normalized detectivity of the "neck-then-oxidize" device is more than an order of magnitude higher than that for the "oxidize-then-neck" device. The highest detectivity was found at a modulation frequency of 30 Hz, and reached $1.3 \times 10^{13}$ jones at 975 nm excitation wavelength.

Figure 7F:
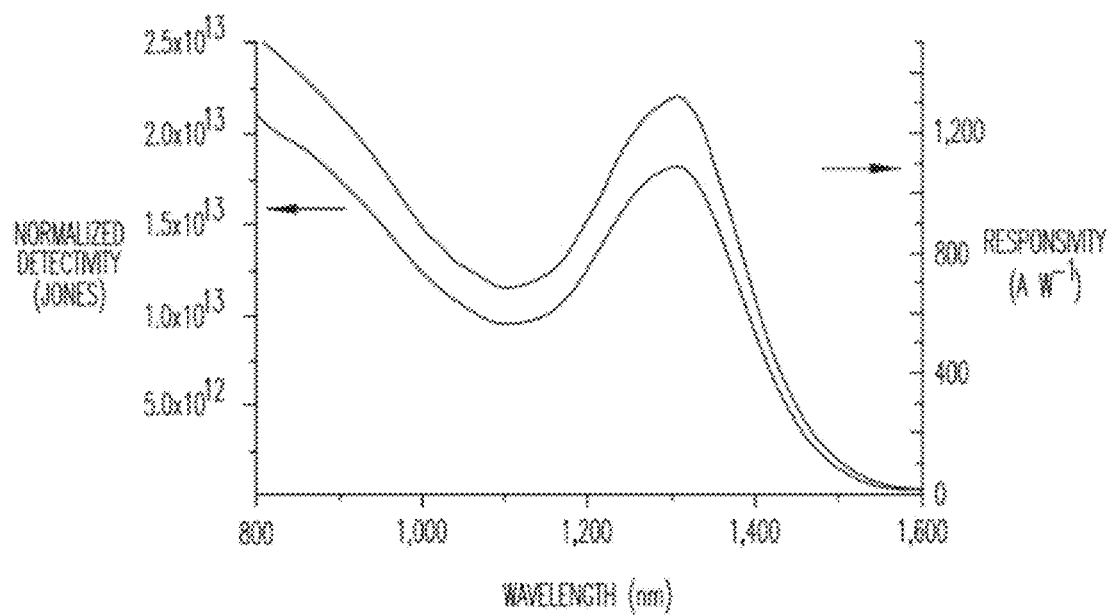
FIG. 7F shows spectra of responsivity and normalized detectivity of a QD layer device.
Figure 7G:
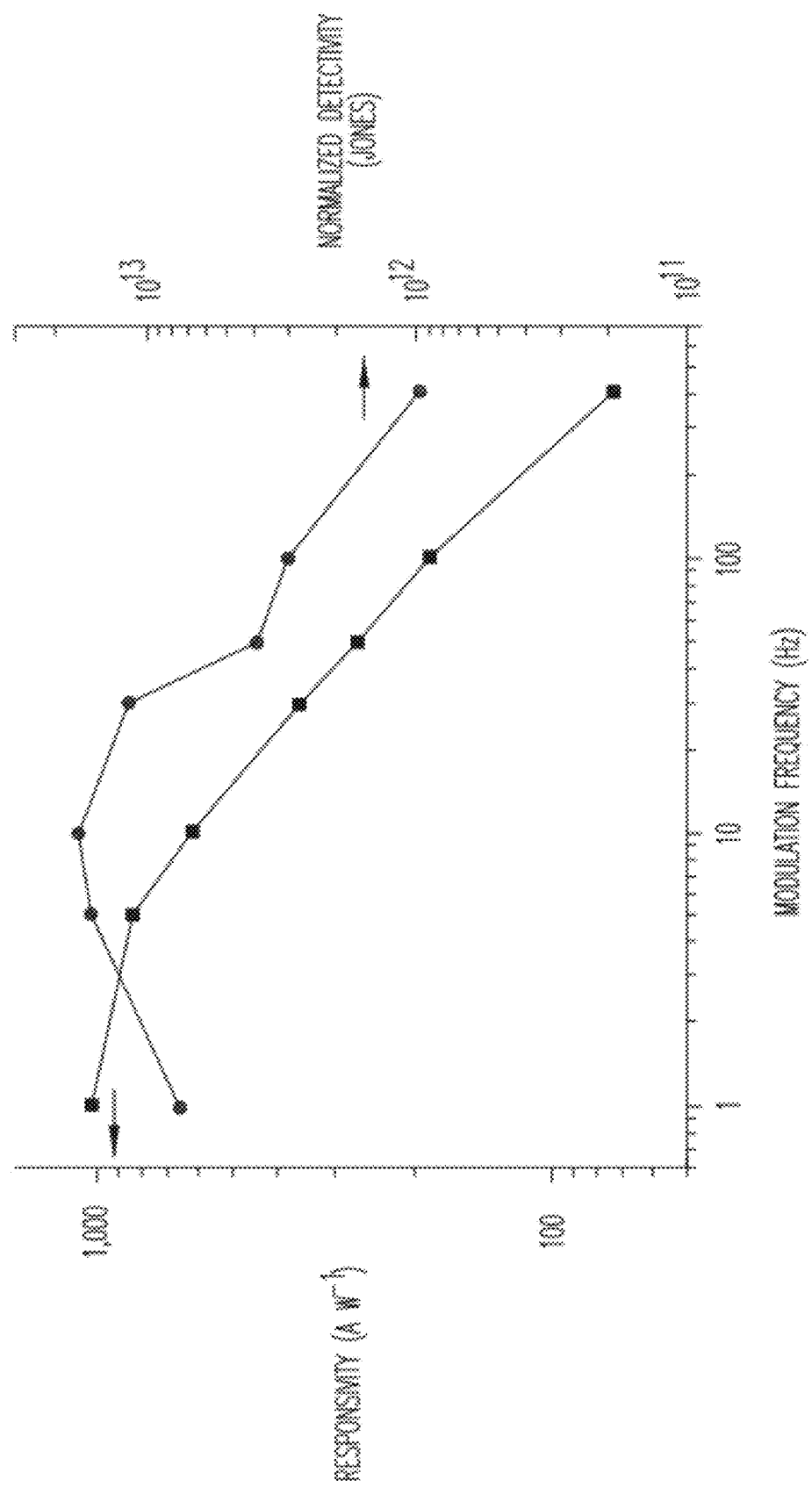
FIG. 7G shows the electrical frequency response of a QD layer device.
Figure 7H:
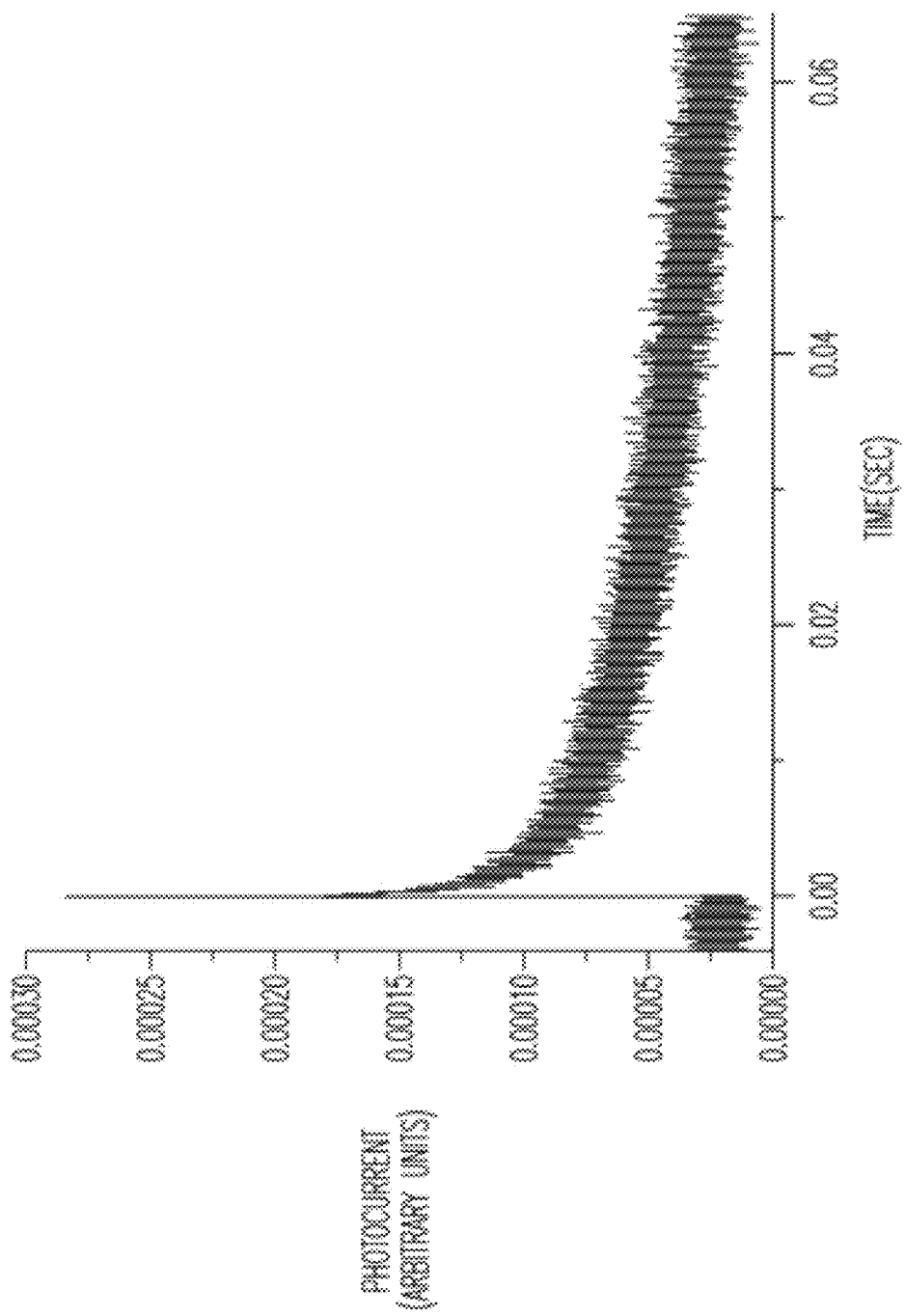
FIG. 7H shows the temporal response of a QD layer device.

FIG. 7F shows the results of further measurements of the "neck-then-oxidize" device described above regarding FIG. 7B. The spectra of responsivity and the normalized detectivity D* is shown for the "neck-then-oxidize" device at an applied bias of 40 V and an electrical frequency of 10 Hz. D* was measured to be $1.8 \times 10^{13}$ jones at the excitonic peak wavelength. FIG. 7G shows the electrical frequency response of the same device under 40 V bias. The 3-dB bandwidth of the detector is about ~18 Hz, consistent with the longest excited-state carrier lifetime in the device. High sensitivity (D*>$10^{13}$ jones) is retained at imaging rates of about 30 frames per second.

FIG. 7G shows the photocurrent temporal response following excitation of the QD layer of the "neck-then-oxidize" device of FIG. 7B, where the excitation was a 7 ns pulse centered at 1064 nm, at a frequency of 15 Hz. This allows investigation of the transit time and distribution of carrier lifetimes in the device. The response of the detector to the optical pulse was found to persist over tens of milliseconds, attributable to the longest-lived population of trap states introduced by oxidation. The response exhibits multiple lifetime components that extend from microseconds (though shorter components may exist they are not observable in this measurement) to several milliseconds. Decay components were found at about 20 µs, about 200 µs, about 2 ms, about 7 ms, and about 70 ms. A transit time of about 500 ns was obtained for a bias of about 100 V, revealing that transit time depends linearly on bias with a slope corresponding to a mobility of about 0.1 $cm^2V^{-1} s^{-1}$. The ratio of the longest component of carrier lifetime to the transit time was thus on the order of about 10,000. The observed responsivity of about 2700 A/W in this example could thus be explained by photoconductive gain, given the films absorbance of 0.3 at an optical wavelength of 975 nm. This high responsivity was observed under low-level optical power conditions relevant to ultrasensitive detection. In general, in some embodiments, as illumination intensity was increased, the longest-lived trap states became filled, and shorter lived, so lower-gain trap states began to account for a significant component of carrier lifetime. The devices of these embodiments were thus highly sensitive under low-light conditions, and exhibit intrinsic dynamic-range-enhancing gain compression under increasing illumination intensity.

For determining the photocurrent spectral response, a bias of 50 V was applied to the sample connected in series with a 100 Ohm load resistor. Illumination was provided by a white light source dispersed by a Triax 320 monochromator and mechanically chopped at a frequency of ~100 Hz. Filters were used to prevent overtones of the monochromator's grating from illuminating the sample. The voltage across the load resistor was measured using a Stanford Research Systems SR830 lock-in amplifier. The intensity through the monochromator at each wavelength was measured separately using a calibrated Ge photodetector. The photocurrent at each wavelength was subsequently scaled accordingly. After the photocurrent spectral shape was determined in this way, the absolute responsivity at 975 nm was used to obtain the absolute spectral response 800 nm-1600 nm, which is shown in FIG. 8.

For measurement of noise current and calculation of NEP and D*, the photoconductive device was placed inside an electrically-shielded and optically-sealed probe station and connected in series with a Stanford Research SR830 lock-in amplifier. Alkaline batteries were used to bias the device for the measurement of the noise current in order to minimize noise components from the source. The lock-in amplifier measured the current in the photodetector and reported noise current in $A/Hz^{1/2}$. Special care was taken in choosing an appropriate passband in order to acquire stable and meaningful measurements of noise current at various frequencies. This measurement revealed a significant increase in the noise current below 5 Hz which is attributed to 1/f noise, while white noise patterns are observed above 50 Hz. The noise current divided by the responsivity under the same measurement conditions of applied bias and frequency modulation yielded the noise equivalent power (NEP). The normalized detectivity, D*, was obtained as a function of wavelength, applied bias, and frequency by dividing the square root of the optically active area of the device by the NEP.

To validate the NEP values obtained using this technique, the identical procedure was preformed using a commercial Si detector with known NEP. The system described above reported NEP values of the same order of magnitude, but typically somewhat larger than, the specified NEPs. The NEP and D* determination procedure used herein thus provides a conservative estimate of these figures of merit.

Figure 8:
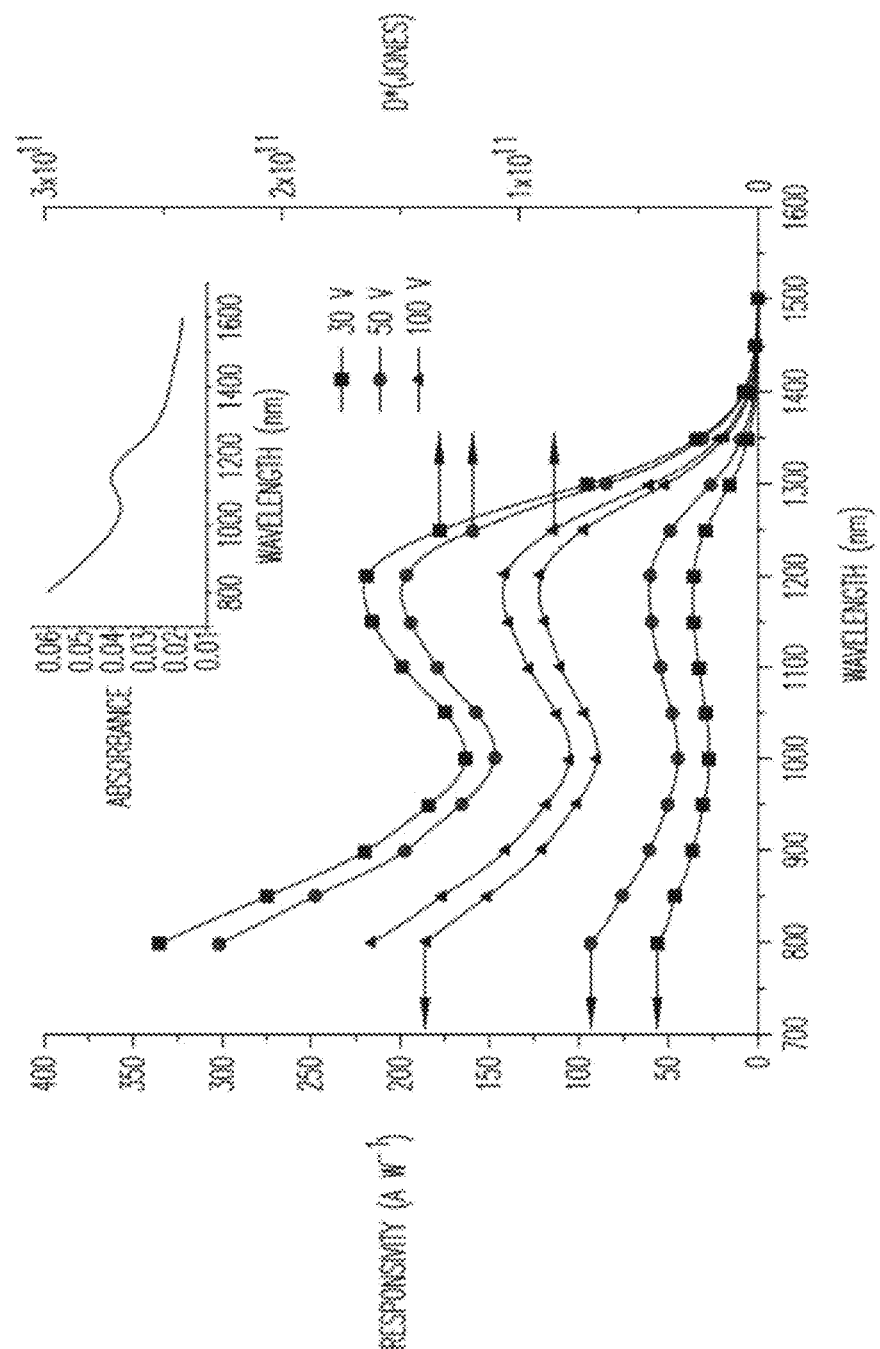
FIG. 8 shows spectral dependence of responsivity and normalized detectivity D* at various levels of applied bias under 5 Hz optical modulation and 0.25 nW incident optical power.

FIG. 8 shows spectral dependence of responsivity and normalized detectivity D* for biases of 30, 50, and 100 V, under 5 Hz optical modulation and 0.25 nW incident optical power. The responsivity shows a local maximum near 1200 nm corresponding with the exciton absorption peak of the nanocrystal solid-state films shown in the inset of FIG. 8. The responsivity increases with voltage (but not as rapidly as does the noise current, resulting in higher D* at lower biases) and reaches 180 A/W at 800 nm. For 30 and 50 V of applied bias, D* is $2 \times 10^{11}$ Jones and is more than double the detectivity of commercial polycrystalline PbS detectors which have benefited from 50 years of science and technology development. Though the responsivity is higher at 100 V, the bias-dependence of the measured noise current results in D* being maximized at the lower bias of 30 V.

Figure 9:
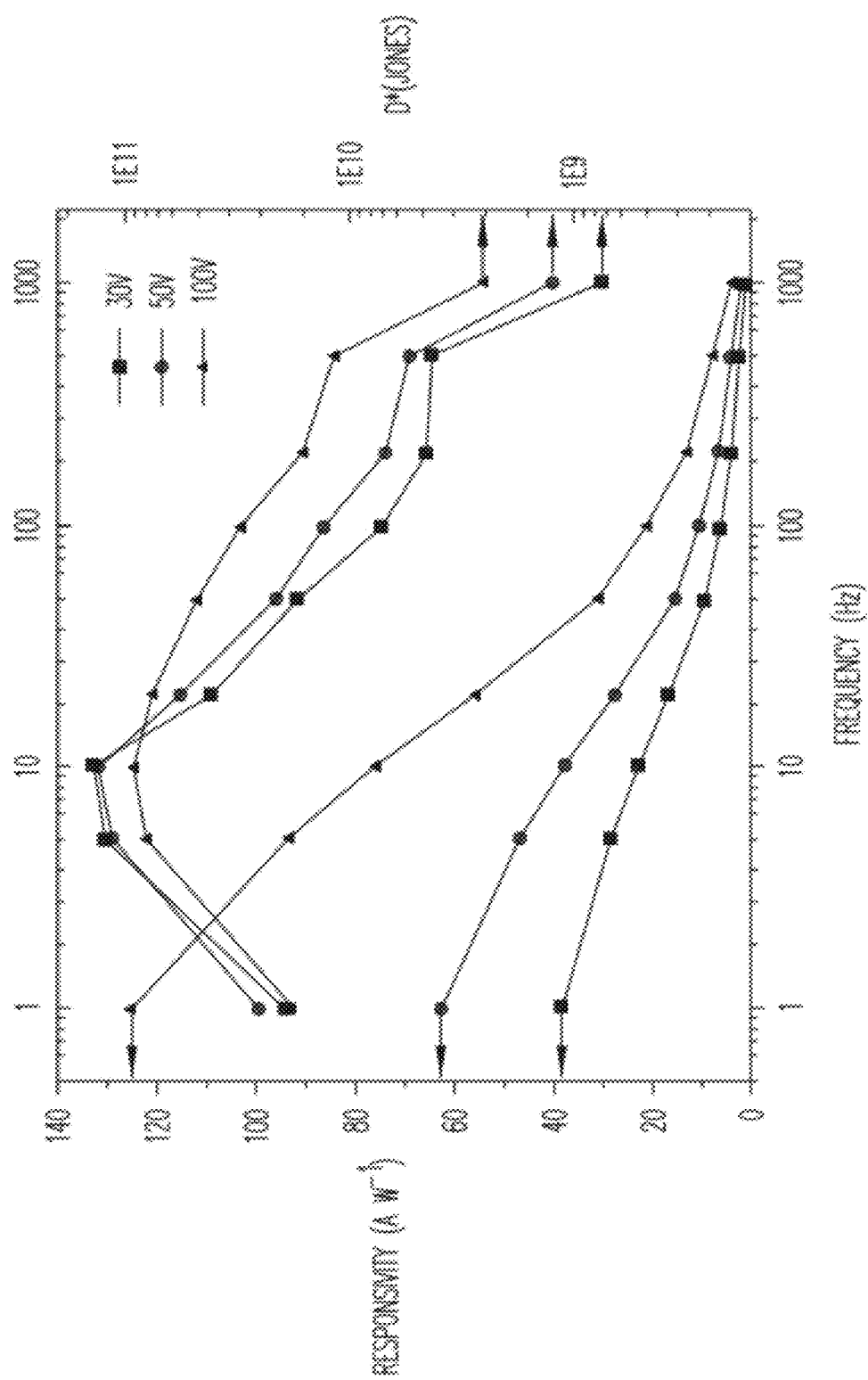
FIG. 9 shows the frequency dependence of responsivity and normalized detectivity at different levels of applied bias at 975 nm and 0.25 nW of incident optical power.
Figure 10:
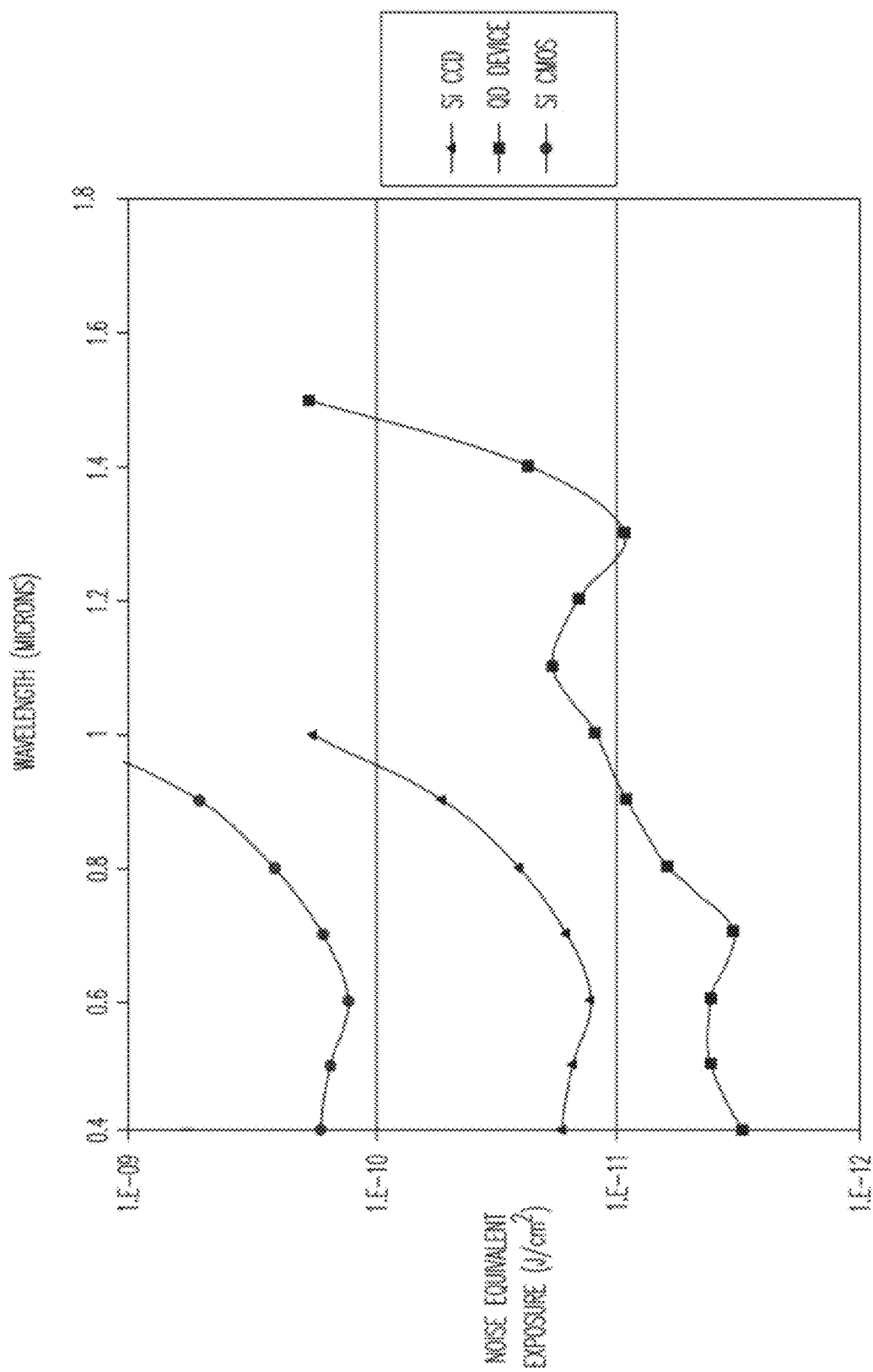
FIG. 10 shows the noise equivalent exposure of a QD layer device as compared with conventional Si CCD and CMOS sensor devices.

FIG. 9 shows the frequency dependence of responsivity and normalized detectivity for three values of applied bias at 975 nm and 0.25 nW of incident optical power. The 3 dB bandwidth of the device responsivity was 15 Hz for 100 V and 50 V and 12 Hz for 30 V. The measurements were taken with optical excitation from a 975 nm laser and incident optical power 0.2 nW. The noise current was also measured for the three different biases throughout the frequency range. The noise current was significantly higher at frequencies below 20 Hz, while frequency-independent white noise was observed at higher frequencies. Noise equivalent exposure, or NEE, is another way of expressing the lowest amount of light detectable by a detector. NEE is defined to be the number of joules of optical energy that can create a signal at the detector that is equivalent in magnitude to the noise on the detector, and is calculated to be the RMS noise on the detector, divided by the responsivity of the detector. FIG. 10 shows the NEE of a QD device having a layer of fused QDs with defect states (e.g., oxidation) on their outer surface, as compared with the NEE of a conventional Si CCD detector as well as a conventional Si CMOS detector. The QD device has an NEE of less than $10^{-11}$ J/cm² at wavelengths of 400 to 800 nm, and further less than $10^{-10}$ J/cm² at wavelengths of 400 to 1400 nm. The NEEs of the conventional Si devices are significantly higher than that of the QD device, in some cases more than an order of magnitude higher.

The figures of merit obtained from the quantum dot detectors presented herein result from a combination of processing procedures. First, the shortening of the distance between QDs via exchange to a much shorter organic ligand provided enhanced inter-QD conduction. Post-deposition treatment using a nonsolvent and exposure to elevated temperatures in an oxygen-rich atmosphere enabled further ligand removal, QD fusing, and the formation of a native oxide on the QD surface. This oxide has previously been shown in polycrystalline PbS devices to be useful in achieving high D* in photoconductors. However, chemical bath-grown polycrystalline devices with 200 nm domain sizes do not allow refined control over interfaces. In contrast, using pre-fabricated, highly monodisperse, individually single-crystal QDs with highly-controlled ligand-passivated surfaces to fabricate optical devices allows exceptional control over interface effects compared with polycrystalline-based devices. The quantum dot optical devices described herein are superior across many figures of merit to conventional grown-crystal semiconductor optical devices. At the same time the fabrication of the devices is strikingly simple, while maintaining optical customizability based on the quantum size effects of quantum dots.

Alternative Embodiments

Although the QDs are solution-deposited in the described embodiments, the QDs may deposited in other ways. As mentioned above, one motivation for using solution-deposition is its ready compatibility with existing CMOS processes. However, satisfactory devices can be made by vacuum-depositing or otherwise depositing the QDs.

Other embodiments are within the following claims.

Incorporated References

The following references, in some cases referred to above as the "incorporated references," are incorporated herein by reference in their entireties.

Sargent, E. H., Infrared quantum dots. *Advanced Materials* 17, 515-522 (2005).

Tessler, N., Medvedev, V., Kazes, M., Kan, S. & Banin, U., Efficient near-infrared polymer nanocrystal light-emitting diodes. *Science* 295, 1506-1508 (2002).

Bakueva, L., Musikhin, S., Hines, M. A., Chang, T.-W. F., Tzolov, M., Scholes, G. D., Sargent, E. H., Size-tunable infrared (1000-1600 nm) electroluminescence from PbS quantum dot nanocrystals in a semiconducting polymer. *Applied Physics Letters* 82, 2895-2897 (2003).

Rong., H., Jones, R., Liu, A., Cohen, O. Hak, D., Fang, A., Paniccia, M., A continuous wave Raman Silicon laser. *Nature* 433, 725-728 (2005).

McDonald, S. A., Konstantatos, G., Zhang, S., Cyr, P. W., Klem, E. J. D., Levina, L., Sargent, E. H., Solution-processed PbS quantum dot infrared photodetectors and photovoltaics. *Nature Materials* 4, 138-142 (2005).

Lim, Y. T., Kim, S., Nakayama, A., Stott, N. E., Bawendi, M. G., Frangioni, J. F., Selection of quantum dot wavelengths for biomedical assays and imaging. *Molecular Imaging* 2, 50-64 (2003).

Kim, S., Lim, Y. T., Soltesz, E. G., De Grand, A. M., Lee, J., Nakayama, A., Parker, J. A., Mihaljevic, T., Laurence, R. G., Dor, D. M., Cohn, L. H., Bawendi, M. G., Frangioni, J.

V., Near-infrared fluorescent type II quantum dots for sentinel lymph node mapping. *Nature Biotechnology* 22, 93-97 (2004).

Ettenberg, M., A little night vision. *Advanced Imaging* 20, 29-32, 2005.

Hines, M. A., Scholes, G. D., Colloidal PbS nanocrystals with size-tunable near-infrared emission: observation of post-synthesis self-narrowing of the particle size distribution. *Advanced Matererials* 15, 1844-1849 (2003).

Yu, D., Wang, C., Guyot-Sionnest, P., n-Type Conducting CdSe Nanocrystal Solids. *Science* 300, 1277-1280, 2003.

Wessels, J. M., Nothofer, H.-G., Ford, W. E., Von Wrochem, F., Scholz, F., Vossmeyer, T., Schroedter, A., Weller, H., Yasuda, A., Optical and electrical properties of three-dimensional interlinked gold nanoparticles assemblies. *Journal of the Americal Chemical Society* 126, 3349-3356 (2004).

Photoconductivity Conference: held at Atlantic City, Nov. 4-6, 1954, Wiley.

Konstantatos, G., Howard, I., Fischer, A., Hoogland, S., Clifford, J., Klem, E., Levina, L., Sargent, E. H., Ultrasensitive solution-cast quantum dot photodetectors. Nature 442, 180-183 (2006).

What is claimed is:

1. A method of forming a nanocrystalline film, the method comprising:

fabricating a plurality of nanocrystals, the nanocrystals having a core and an outer surface, a plurality of first ligands having a first length being attached to the outer surface;

exchanging the plurality of first ligands attached to the outer surface of the nanocrystals for a plurality of second ligands having a second length and having a different chemical composition than the plurality of first ligands;

forming a film of ligand-exchanged nanocrystals, at least a portion of the ligand-exchanged nanocrystals being adjacent at least one other ligand-exchanged nanocrystal; and removing the second ligands attached to the outer surfaces of the nanocrystals of the film of ligand-exchanged nanocrystals so as to bring the outer surfaces of adjacent nanocrystals into closer proximity; and forming an electrical network of nanocrystals.

\* \* \* \* \*

UNITED STATES PATENT AND TRADEMARK OFFICE
CERTIFICATE OF CORRECTION

| | | |
|---|---|---|
| PATENT NO. | : 8,213,212 B2 | |
| APPLICATION NO. | : 13/242397 | |
| DATED | : July 3, 2012 | |
| INVENTOR(S) | : Sargent et al. | |

It is certified that error appears in the above-identified patent and that said Letters Patent is hereby corrected as shown below:

Title Page, Item (75);

On face page 1, in column 1, line 2, inventors, delete "Barcelona" and insert --Castelldefels--, therefor Title Page Item (56);

On face page 1, in column 2, line 1, delete, "", Photoconductivity Conference," and insert --"Photoconductivity Conference,"--, therefor On face page 4, in column 2, line 1, delete "11/327,655,Advisory", and insert --11/327,655, Advisory--, therefor On face page 4, in column 2, line 1, delete "2011",", and insert --2011,"--, therefor On face page 4, in column 2, line 4, delete "2011",", and insert --2011,"--, therefor On face page 4, in column 2, line 6, delete "2009",", and insert --2009,"--, therefor On face page 4, in column 2, line 8, delete "2008",", and insert --2008,"--, therefor On face page 4, in column 2, line 10, delete "2010",", and insert --2010,"--, therefor On face page 4, in column 2, line 12, delete "2008",", and insert --2008,"--, therefor On face page 4, in column 2, line 14, delete "2007",", and insert --2007,"--, therefor On face page 4, in column 2, line 16, delete "2010",", and insert --2010,"--, therefor On face page 4, in column 2, line 18, delete "2011",", and insert --2011,"--, therefor Signed and Sealed this
Eighteenth Day of September, 2012

David J. Kappos
*Director of the United States Patent and Trademark Office*

On face page 4, in column 2, line 20, delete "2007",", and insert --2007,"--, therefor On face page 4, in column 2, line 22, delete "2009",", and insert --2009,"--, therefor On face page 4, in column 2, line 24, delete "2010",", and insert --2010,"--, therefor On face page 4, in column 2, line 26, delete "2010",", and insert --2010,"--, therefor On face page 4, in column 2, line 28, delete "2009",", and insert --2009,"--, therefor On face page 4, in column 2, line 30, delete "2008",", and insert --2008,"--, therefor On face page 4, in column 2, line 32, delete "2008",", and insert --2008,"--, therefor On face page 4, in column 2, line 34, delete "2009",", and insert --2009,"--, therefor On face page 4, in column 2, line 36, delete "2010",", and insert --2010,"--, therefor On face page 4, in column 2, line 38, delete "2010",", and insert --2010,"--, therefor On face page 4, in column 2, line 40, delete "2009",", and insert --2009,"--, therefor On face page 4, in column 2, line 42, delete "2008",", and insert --2008,"--, therefor On face page 4, in column 2, line 44, delete "2008",", and insert --2008,"--, therefor On face page 4, in column 2, line 46, delete "2009",", and insert --2009,"--, therefor On face page 4, in column 2, line 48, delete "2010",", and insert --2010,"--, therefor On face page 4, in column 2, line 50, delete "2010",", and insert --2010,"--, therefor On face page 5, in column 1, line 2, delete "2009",", and insert --2009,"--, therefor On face page 5, in column 1, line 4, delete "2008",", and insert --2008,"--, therefor On face page 5, in column 1, line 6, delete "2008",", and insert --2008,"--, therefor On face page 5, in column 1, line 8, delete "2010",", and insert --2010,"--, therefor On face page 5, in column 1, line 10, delete "2010",", and insert --2010,"--, therefor On face page 5, in column 1, line 12, delete "2009",", and insert --2009,"--, therefor On face page 5, in column 1, line 14, delete "2010",", and insert --2010,"--, therefor On face page 5, in column 1, line 16, delete "2010","", and insert --2010,"--, therefor On face page 5, in column 1, line 18, delete "2010","", and insert --2010,"--, therefor On face page 5, in column 1, line 20, delete "2011","", and insert --2011,"--, therefor On face page 5, in column 1, line 22, delete "2010","", and insert --2010,"--, therefor On face page 5, in column 1, line 24, delete "2010","", and insert --2010,"--, therefor On face page 5, in column 1, line 26, delete "2011","", and insert --2011,"--, therefor On face page 5, in column 1, line 28, delete "2010","", and insert --2010,"--, therefor On face page 5, in column 1, line 30, delete "2011","", and insert --2011,"--, therefor On face page 5, in column 1, line 31, delete "12/852,328 ,", and insert --12/852,328,--, therefor On face page 5, in column 1, line 32, delete "2011","", and insert --2011,"--, therefor On face page 5, in column 1, line 34, delete "2011","", and insert --2011,"--, therefor On face page 5, in column 1, line 36, delete "2009","", and insert --2009,"--, therefor On face page 5, in column 1, line 38, delete "2009","", and insert --2009,"--, therefor On face page 5, in column 1, line 40, delete "2011","", and insert --2011,"--, therefor On face page 5, in column 1, line 42, delete "Filed" and insert --filed--, therefor On face page 5, in column 1, line 42, delete "2011","", and insert --2011,"--, therefor On face page 5, in column 1, line 43, delete "Polymers","", and insert --polymers,"--, therefor On face page 5, in column 1, line 46, delete "Nanocomposites","", and insert --Nanocomposites,"--, therefor On face page 5, in column 1, line 49, delete "2005","", and insert --2005,"--, therefor On face page 5, in column 1, line 51, delete "2006","", and insert --2006,"--, therefor On face page 5, in column 1, line 53, delete "2007","", and insert --2007,"--, therefor On face page 5, in column 1, line 55, delete "2007","", and insert --2007,"--, therefor On face page 5, in column 1, line 57, delete "2007","", and insert --2007,"--, therefor On face page 5, in column 1, line 59, delete "Nanocomposites","", and insert --Nanocomposites,"--, therefor On face page 5, in column 1, line 63, delete "Polymers","", and insert --polymers,"--, therefor On face page 5, in column 1, line 66, delete "Diodes","", and insert --Diodes,"--, therefor On face page 5, in column 1, line 69, delete "Cells","", and insert --Cells,"--, therefor On face page 5, in column 1, line 71, delete "Performace", and insert --Performance,--, therefor On face page 5, in column 1, line 72, delete "eds.,,", and insert --eds.,--, therefor On face page 5, in column 2, line 2, delete "nanocrystals","", and insert --nanocrystals,"--, therefor On face page 5, in column 2, line 6, delete "devices","", and insert --devices,"--, therefor On face page 5, in column 2, line 8, delete "exchange","", and insert --exchange,"--, therefor On face page 5, in column 2, line 11, delete "Composites","", and insert ---Composites,"--, therefor On face page 5, in column 2, line 13, delete "Interfiffusion"," and insert --Interdiffusion,"--, therefor On face page 5, in column 2, line 15, delete "Collodial", and insert --Colloidal--, therefor On face page 5, in column 2, line 16, delete "Solids","", and insert --Solids,"--, therefor On face page 5, in column 2, line 17, delete "vision","", and insert --vision,"--, therefor On face page 5, in column 2, line 19, delete "Ubiquitos", and insert --Ubiquitous--, therefor On face page 5, in column 2, line 20, delete "Plastic","", and insert --Plastic,"--, therefor On face page 5, in column 2, line 23, delete "Derivative","", and insert --Derivative,"--, therefor On face page 5, in column 2, line 26, delete "Nanocrystals","", and insert --Nanocrystals,"--, therefor On face page 5, in column 2, line 28, delete "Spectroscopy","", and insert --Spectroscopy,"--, therefor On face page 5, in column 2, line 32, delete "Photoconductivity","", and insert --Photoconductivity,"--, therefor On face page 5, in column 2, line 33, delete "B 54", and insert --B.54--, therefor On face page 5, in column 2, line 35, delete "MEH-PPV",", and insert --MEH-PPV,"--, therefor On face page 5, in column 2, line 38, delete "Applications",", and insert --Applications,"--, therefor On face page 5, in column 2, line 42, delete "Distribution",", and insert --Distribution,"--, therefor On face page 5, in column 2, line 45, delete "Devices",", and insert --Devices,"--, therefor On face page 5, in column 2, line 48, delete "Cells",", and insert --Cells,"--, therefor On face page 5, in column 2, line 49, delete "Cells",", and insert --Cells,"--, therefor On face page 5, in column 2, line 53, delete "Diodes",", and insert --Diodes,"--, therefor On face page 5, in column 2, line 55, delete "mapping",", and insert --mapping,"--, therefor On face page 5, in column 2, line 58, delete "Mesophases",", and insert --Mesophases,"--, therefor On face page 5, in column 2, line 61, delete "00-1700 nm",", and insert --00-1700 nm,"--, therefor On face page 5, in column 2, line 64, delete "53101-53101.",", and insert --53101."--, therefor On face page 5, in column 2, line 67, delete "Lasing",", and insert --Lasing,"--, therefor On face page 5, in column 2, line 71, delete "Cells",", and insert --Cells,"--, therefor On face page 6, in column 1, line 2, delete "photodetectors",", and insert --photodetectors,"--, therefor On face page 6, in column 1, line 4, delete "Treatments",", and insert --Treatments,"--, therefor On face page 6, in column 1, line 7, delete "imaging",", and insert --imaging,"--, therefor On face page 6, in column 1, line 9, delete "Nanocrystals",", and insert --Nanocrystals,"--, therefor On face page 6, in column 1, line 13, delete "photodetectors",", and insert --photodetectors,"--, therefor On face page 6, in column 1, line 18, delete "photovoltaics",", and insert --photovoltaics,"--, therefor On face page 6, in column 1, line 21, delete "Nanocrystallites",", and insert --Nanocrystallites,"--, therefor On face page 6, in column 1, line 25, delete "Filmes",", and insert --Filmes,"--, therefor On face page 6, in column 1, line 29, delete "Morphology",", and insert --Morphology,"--, therefor CERTIFICATE OF CORRECTION (continued)
U.S. Pat. No. 8,213,212 B2

On face page 6, in column 1, line 31, delete "Cells",", and insert --Cells,"--, therefor On face page 6, in column 1, line 33, delete "Laser",", and insert --Laser,"--, therefor On face page 6, in column 1, line 35, delete "Dots",", and insert --Dots,"--, therefor On face page 6, in column 1, line 40, delete "nm",", and insert --nm,"--, therefor On face page 6, in column 2, line 3, delete "Polymer",", and insert --Polymer,"--, therefor On face page 6, in column 2, line 5, delete "wavelength",", and insert --wavelength,"--, therefor On face page 6, in column 2, line 9, delete "Device",", and insert --Device,"--, therefor On face page 6, in column 2, line 12, delete "Provisioning",", and insert --Provisioning,"--, therefor On face page 6, in column 2, line 16, delete "Sensors",", and insert --Sensors,"--, therefor On face page 6, in column 2, line 21, delete "diodes",", and insert --diodes,"--, therefor On face page 6, in column 2, line 22-23, delete "Polymers",", and insert ---Polymers,"--, therefor On face page 6, in column 2, line 25, delete "polymers",", and insert --polymers,"--, therefor On face page 6, in column 2, line 28, delete "films",", and insert --films,"--, therefor On face page 6, in column 2, line 31, delete "assemblies",", and insert --assemblies,"--, therefor On face page 6, in column 2, line 34, delete "Photodiode",", and insert --Photodiode,"--, therefor On face page 6, in column 2, line 36, delete "Solids",", and insert --Solids,"--, therefor On face page 6, in column 2, line 39, delete "nanocrystals",", and insert --nanocrystals,"--, therefor On face page 6, in column 2, line 42, delete "2012",", and insert --2012,"--, therefor In column 2, line 1, delete "core is", and insert --core,--, therefor In column 2, line 54, delete "manufacturaable", and insert --manufacturable--, therefor In column 5, line 26, delete "nanocrystals", and insert --.--, therefor In column 12, line 23-24, delete ""necking"", and insert --"necking."--, therefor In column 13, line 13, delete "though", and insert --thought--, therefor

CERTIFICATE OF CORRECTION (continued)
U.S. Pat. No. 8,213,212 B2

In column 13, line 28, after "exhibits a", delete "a", therefor

In column 13, line 30, after "k-Ohm/square", insert --.--, therefor

In column 14, line 50, after "bias", insert --,--, therefor

In column 14, line 53, delete "12", and insert --32--, therefor

In column 14, line 64, after "electrode", delete "32", therefor

In column 15, line 45, delete "44", and insert --44'--, therefor

In column 16, line 12, delete "sensors;", and insert --sensors.--, therefor

In column 16, line 44, delete "layers.", and insert --layers--, therefor

In column 17, line 14, after "thay", insert --are--, therefor

In column 22, line 1, delete "reference", and insert --referenced--, therefor

In column 22, line 12, after "soaking", insert --also--, therefor

In column 22, line 12, after "exhibits", insert --also--, therefor

In column 22, line 58, delete "thence", and insert --then--, therefor

In column 26, line 32, after "may", insert --be--, therefor

In column 27, line 9, delete "Matererials", and insert --Materials--, therefor

In column 27, line 16, delete "Americal", and insert --American--, therefor